United States Patent
Takano

(10) Patent No.: US 12,008,247 B2
(45) Date of Patent: Jun. 11, 2024

(54) MEMORY SYSTEM

(71) Applicant: KIOXIA CORPORATION, Tokyo (JP)

(72) Inventor: Takayuki Takano, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 21 days.

(21) Appl. No.: 17/884,283

(22) Filed: Aug. 9, 2022

(65) Prior Publication Data

US 2023/0214136 A1 Jul. 6, 2023

(30) Foreign Application Priority Data

Jan. 5, 2022 (JP) ................................ 2022-000487

(51) Int. Cl.
*G06F 12/00* (2006.01)
*G06F 3/06* (2006.01)

(52) U.S. Cl.
CPC .......... *G06F 3/0625* (2013.01); *G06F 3/0629* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 8,300,482 B2 | 10/2012 | Bae | |
| 10,692,555 B2 | 6/2020 | Oh et al. | |
| 11,194,656 B2 | 12/2021 | Igahara et al. | |
| 2009/0322770 A1 | 12/2009 | Bae | |
| 2015/0095520 A1 | 4/2015 | Kwack | |
| 2019/0172512 A1 | 6/2019 | Oh et al. | |
| 2020/0341838 A1* | 10/2020 | Hollis | G06F 11/1008 |
| 2020/0387425 A1* | 12/2020 | Igahara | G06F 11/1048 |
| 2021/0247928 A1* | 8/2021 | Zhang | G11C 11/4091 |

* cited by examiner

*Primary Examiner* — Daniel D Tsui
(74) *Attorney, Agent, or Firm* — Kim & Stewart LLP

(57) ABSTRACT

A memory system includes a nonvolatile memory and a controller that includes an encoder configured to encode a first group of data including a plurality of first data, each first data having a plurality of bits. The encoder is configured to perform a first encoding process of generating a second group of data including a plurality of second data from the plurality of first data in the first group, and a second encoding process of generating a third group of data including a plurality of third data from the plurality of second data in the second group. A logical value of "1" is less likely to be the value in an n-th bit position of the plurality of third data in the third group than the value in any of the bit positions of the plurality of second data in the second group.

20 Claims, 15 Drawing Sheets

FIG. 5

| | FIRST DATA |
|---|---|
| A-1 | 0000 |
| B-1 | 0001 |
| C-1 | 0010 |
| D-1 | 0011 |
| E-1 | 0100 |
| F-1 | 0101 |
| G-1 | 0110 |
| H-1 | 0111 |
| I-1 | 1000 |
| J-1 | 1001 |
| K-1 | 1010 |
| L-1 | 1011 |
| M-1 | 1100 |
| N-1 | 1101 |
| O-1 | 1110 |
| P-1 | 1111 |

700

| | SECOND DATA | FLAG |
|---|---|---|
| A-2 | 0000 | 0 |
| B-2 | 0001 | 0 |
| C-2 | 0010 | 0 |
| D-2 | 0011 | 0 |
| E-2 | 0100 | 0 |
| F-2 | 0101 | 0 |
| G-2 | 0110 | 0 |
| H-2 | 1000 | 1 |
| I-2 | 1000 | 0 |
| J-2 | 1001 | 0 |
| K-2 | 1010 | 0 |
| L-2 | 0100 | 1 |
| M-2 | 1100 | 0 |
| N-2 | 0010 | 1 |
| O-2 | 0001 | 1 |
| P-2 | 0000 | 1 |

720

| | THIRD DATA | FLAG |
|---|---|---|
| A-3 | 0000 | 0 |
| B-3 | 0001 | 0 |
| C-3 | 0010 | 0 |
| D-3 | 0011 | 0 |
| E-3 | 0100 | 0 |
| F-3 | 0101 | 0 |
| G-3 | 0110 | 0 |
| H-3 | 0111 | 1 |
| I-3 | 0111 | 0 |
| J-3 | 1000 | 0 |
| K-3 | 1001 | 0 |
| L-3 | 0100 | 1 |
| M-3 | 1010 | 0 |
| N-3 | 0010 | 1 |
| O-3 | 0001 | 1 |
| P-3 | 0000 | 1 |

| | THIRD DATA | FLAG |
|---|---|---|
| A-3 | | 0 |
| B-3 | | 0 |
| C-3 | | 0 |
| D-3 | | 0 |
| E-3 | | 0 |
| F-3 | | 0 |
| G-3 | | 0 |
| H-3 | | 1 |
| I-3 | | 0 |
| J-3 | | 0 |
| K-3 | | 0 |
| L-3 | | 1 |
| M-3 | | 0 |
| N-3 | | 1 |
| O-3 | | 1 |
| P-3 | | 1 |

| | THIRD DATA | FLAG |
|---|---|---|
| A-3 | 0000 | 0 |
| B-3 | 0001 | 0 |
| C-3 | 0010 | 0 |
| D-3 | 0011 | 0 |
| E-3 | 0100 | 0 |
| F-3 | 0101 | 0 |
| G-3 | 0110 | 0 |
| H-3 | | 1 |
| I-3 | 0111 | 0 |
| J-3 | 1000 | 0 |
| K-3 | 1001 | 0 |
| L-3 | | 1 |
| M-3 | 1010 | 0 |
| N-3 | | 1 |
| O-3 | | 1 |
| P-3 | | 1 |

| | THIRD DATA | FLAG |
|---|---|---|
| A-3 | 0000 | 0 |
| B-3 | 0001 | 0 |
| C-3 | 0010 | 0 |
| D-3 | 0011 | 0 |
| E-3 | 0100 | 0 |
| F-3 | 0101 | 0 |
| G-3 | 0110 | 0 |
| H-3 | 0111 | 1 |
| I-3 | 0111 | 0 |
| J-3 | 1000 | 0 |
| K-3 | 1001 | 0 |
| L-3 | 0100 | 1 |
| M-3 | 1010 | 0 |
| N-3 | 0010 | 1 |
| O-3 | 0001 | 1 |
| P-3 | 0000 | 1 |

FIG. 7A

| bit3 | bit2 | bit1 | bit0 |
|---|---|---|---|
| 0 | 0 | 0 | 0 |
| 0 | 0 | 0 | 1 |
| 0 | 0 | 1 | 0 |
| 0 | 0 | 1 | 1 |
| 0 | 1 | 0 | 0 |
| 0 | 1 | 0 | 1 |
| 0 | 1 | 1 | 0 |
| 0 | 1 | 1 | 1 |
| 1 | 0 | 0 | 0 |
| 1 | 0 | 0 | 1 |
| 1 | 0 | 1 | 0 |
| 1 | 0 | 1 | 1 |
| 1 | 1 | 0 | 0 |
| 1 | 1 | 0 | 1 |
| 1 | 1 | 1 | 0 |
| 1 | 1 | 1 | 1 |
| TOTAL NUMBER OF 1: 8 | 8 | 8 | 8 |

FIG. 7B

| bit3 | bit2 | bit1 | bit0 |
|---|---|---|---|
| 0 | 0 | 0 | 0 |
| 0 | 0 | 0 | 1 |
| 0 | 0 | 1 | 0 |
| 0 | 0 | 1 | 1 |
| 0 | 1 | 0 | 0 |
| 0 | 1 | 0 | 1 |
| 0 | 1 | 1 | 0 |
| 1 | 0 | 0 | 0 |
| 1 | 0 | 0 | 0 |
| 1 | 0 | 0 | 1 |
| 1 | 0 | 1 | 0 |
| 0 | 1 | 0 | 0 |
| 1 | 1 | 0 | 0 |
| 0 | 0 | 1 | 0 |
| 0 | 0 | 0 | 1 |
| 0 | 0 | 0 | 0 |
| TOTAL NUMBER OF 1: 5 | 5 | 5 | 5 |

FIG. 7C

| bit3 | bit2 | bit1 | bit0 |
|---|---|---|---|
| 0 | 0 | 0 | 0 |
| 0 | 0 | 0 | 1 |
| 0 | 0 | 1 | 0 |
| 0 | 0 | 1 | 1 |
| 0 | 1 | 0 | 0 |
| 0 | 1 | 0 | 1 |
| 0 | 1 | 1 | 0 |
| 0 | 1 | 1 | 1 |
| 0 | 1 | 1 | 1 |
| 1 | 0 | 0 | 0 |
| 1 | 0 | 0 | 1 |
| 0 | 1 | 0 | 0 |
| 1 | 0 | 1 | 0 |
| 0 | 0 | 1 | 0 |
| 0 | 0 | 0 | 1 |
| 0 | 0 | 0 | 0 |
| TOTAL NUMBER OF 1: 3 | 6 | 7 | 7 |

FIG. 8A

| FIRST DATA | SECOND DATA | FLAG | THIRD DATA |
|---|---|---|---|
| 00000000 | 00000000 | 0 | 00000000 |
| 00000001 | 00000001 | 0 | 00000001 |
| 00000010 | 00000010 | 0 | 00000010 |
| 00000011 | 00000011 | 0 | 00000011 |
| 00000100 | 00000100 | 0 | 00000100 |
| 00000101 | 00000101 | 0 | 00000101 |
| 00000110 | 00000110 | 0 | 00000110 |
| 00000111 | 00000111 | 0 | 00000111 |
| 00001000 | 00001000 | 0 | 00001000 |
| 00001001 | 00001001 | 0 | 00001001 |
| 00001010 | 00001010 | 0 | 00001010 |
| 00001011 | 00001011 | 0 | 00001011 |
| 00001100 | 00001100 | 0 | 00001100 |
| 00001101 | 00001101 | 0 | 00001101 |
| 00001110 | 00001110 | 0 | 00001110 |
| 00001111 | 00001111 | 0 | 00001111 |
| 00010000 | 00010000 | 0 | 00010000 |
| 00010001 | 00010001 | 0 | 00010001 |
| 00010010 | 00010010 | 0 | 00010010 |
| 00010011 | 00010011 | 0 | 00010011 |
| 00010100 | 00010100 | 0 | 00010100 |
| 00010101 | 00010101 | 0 | 00010101 |
| 00010110 | 00010110 | 0 | 00010110 |
| 00010111 | 00010111 | 0 | 00010111 |
| 00011000 | 00011000 | 0 | 00011000 |
| 00011001 | 00011001 | 0 | 00011001 |
| 00011010 | 00011010 | 0 | 00011010 |
| 00011011 | 00011011 | 0 | 00011011 |
| 00011100 | 00011100 | 0 | 00011100 |
| 00011101 | 00011101 | 0 | 00011101 |
| 00011110 | 00011110 | 0 | 00011110 |
| 00011111 | 11100000 | 1 | |
| 00100000 | 00100000 | 0 | 00011111 |
| 00100001 | 00100001 | 0 | 00100000 |
| 00100010 | 00100010 | 0 | 00100001 |
| 00100011 | 00100011 | 0 | 00100010 |
| 00100100 | 00100100 | 0 | 00100011 |
| 00100101 | 00100101 | 0 | 00100100 |
| 00100110 | 00100110 | 0 | 00100101 |
| 00100111 | 00100111 | 0 | 00100110 |
| 00101000 | 00101000 | 0 | 00100111 |
| 00101001 | 00101001 | 0 | 00101000 |
| 00101010 | 00101010 | 0 | 00101001 |
| 00101011 | 00101011 | 0 | 00101010 |
| 00101100 | 00101100 | 0 | 00101011 |
| 00101101 | 00101101 | 0 | 00101100 |
| 00101110 | 00101110 | 0 | 00101101 |
| 00101111 | 11010000 | 1 | |
| 00110000 | 00110000 | 0 | 00101110 |
| 00110001 | 00110001 | 0 | 00101111 |
| 00110010 | 00110010 | 0 | 00110000 |
| 00110011 | 00110011 | 0 | 00110001 |
| 00110100 | 00110100 | 0 | 00110010 |
| 00110101 | 00110101 | 0 | 00110011 |

FIG. 8B

| FIRST DATA | SECOND DATA | FLAG | THIRD DATA |
|---|---|---|---|
| 01011010 | 01011010 | 0 | 01010001 |
| 01011011 | 10100100 | 1 | |
| 01011100 | 01011100 | 0 | 01010010 |
| 01011101 | 10100010 | 1 | |
| 01011110 | 10100001 | 1 | |
| 01011111 | 10100000 | 1 | |
| 01100000 | 01100000 | 0 | 01010011 |
| 01100001 | 01100001 | 0 | 01010100 |
| 01100010 | 01100010 | 0 | 01010101 |
| 01100011 | 01100011 | 0 | 01010110 |
| 01100100 | 01100100 | 0 | 01010111 |
| 01100101 | 01100101 | 0 | 01011000 |
| 01100110 | 01100110 | 0 | 01011001 |
| 01100111 | 10011000 | 1 | |
| 01101000 | 01101000 | 0 | 01011010 |
| 01101001 | 01101001 | 0 | 01011011 |
| 01101010 | 01101010 | 0 | 01011100 |
| 01101011 | 10010100 | 1 | |
| 01101100 | 01101100 | 0 | 01011101 |
| 01101101 | 10010010 | 1 | |
| 01101110 | 10010001 | 1 | |
| 01101111 | 10010000 | 1 | |
| 01110000 | 01110000 | 0 | 01011110 |
| 01110001 | 01110001 | 0 | 01011111 |
| 01110010 | 01110010 | 0 | 01100000 |
| 01110011 | 10001100 | 1 | |
| 01110100 | 01110100 | 0 | 01100001 |
| 01110101 | 10001010 | 1 | |
| 01110110 | 10001001 | 1 | |
| 01110111 | 10001000 | 1 | |
| 01111000 | 01111000 | 0 | 01100010 |
| 01111001 | 10000110 | 1 | |
| 01111010 | 10000101 | 1 | |
| 01111011 | 10000100 | 1 | |
| 01111100 | 10000011 | 1 | |
| 01111101 | 10000010 | 1 | |
| 01111110 | 10000001 | 1 | |
| 01111111 | 10000000 | 1 | |
| 10000000 | 10000000 | 0 | 01100011 |
| 10000001 | 10000001 | 0 | 01100100 |
| 10000010 | 10000010 | 0 | 01100101 |
| 10000011 | 10000011 | 0 | 01100110 |
| 10000100 | 10000100 | 0 | 01100111 |
| 10000101 | 10000101 | 0 | 01101000 |
| 10000110 | 10000110 | 0 | 01101001 |
| 10000111 | 10000111 | 0 | 01101010 |
| 10001000 | 10001000 | 0 | 01101011 |
| 10001001 | 10001001 | 0 | 01101100 |
| 10001010 | 10001010 | 0 | 01101101 |
| 10001011 | 10001011 | 0 | 01101110 |
| 10001100 | 10001100 | 0 | 01101111 |
| 10001101 | 10001101 | 0 | 01110000 |
| 10001110 | 10001110 | 0 | 01110001 |
| 10001111 | 01110000 | 1 | |

FIG. 8C

| FIRST DATA | SECOND DATA | FLAG | THIRD DATA |
|---|---|---|---|
| 10110100 | 10110100 | 0 | 10001011 |
| 10110101 | 01001010 | 1 | |
| 10110110 | 01001001 | 1 | |
| 10110111 | 01001000 | 1 | |
| 10111000 | 10111000 | 0 | 10001100 |
| 10111001 | 01000110 | 1 | |
| 10111010 | 01000101 | 1 | |
| 10111011 | 01000100 | 1 | |
| 10111100 | 01000011 | 1 | |
| 10111101 | 01000010 | 1 | |
| 10111110 | 01000001 | 1 | |
| 10111111 | 01000000 | 1 | |
| 11000000 | 11000000 | 0 | 10001101 |
| 11000001 | 11000001 | 0 | 10001110 |
| 11000010 | 11000010 | 0 | 10001111 |
| 11000011 | 11000011 | 0 | 10010000 |
| 11000100 | 11000100 | 0 | 10010001 |
| 11000101 | 11000101 | 0 | 10010010 |
| 11000110 | 11000110 | 0 | 10010011 |
| 11000111 | 00111000 | 1 | |
| 11001000 | 11001000 | 0 | 10010100 |
| 11001001 | 11001001 | 0 | 10010101 |
| 11001010 | 11001010 | 0 | 10010110 |
| 11001011 | 00110100 | 1 | |
| 11001100 | 11001100 | 0 | 10010111 |
| 11001101 | 00110010 | 1 | |
| 11001110 | 00110001 | 1 | |
| 11001111 | 00110000 | 1 | |
| 11010000 | 11010000 | 0 | 10011000 |
| 11010001 | 11010001 | 0 | 10011001 |
| 11010010 | 11010010 | 0 | 10011010 |
| 11010011 | 00101100 | 1 | |
| 11010100 | 11010100 | 0 | 10011011 |
| 11010101 | 00101010 | 1 | |
| 11010110 | 00101001 | 1 | |
| 11010111 | 00101000 | 1 | |
| 11011000 | 11011000 | 0 | 10011100 |
| 11011001 | 00100110 | 1 | |
| 11011010 | 00100101 | 1 | |
| 11011011 | 00100100 | 1 | |
| 11011100 | 00100011 | 1 | |
| 11011101 | 00100010 | 1 | |
| 11011110 | 00100001 | 1 | |
| 11011111 | 00100000 | 1 | |
| 11100000 | 11100000 | 0 | 10011101 |
| 11100001 | 11100001 | 0 | 10011110 |
| 11100010 | 11100010 | 0 | 10011111 |
| 11100011 | 00011100 | 1 | |
| 11100100 | 11100100 | 0 | 10100000 |
| 11100101 | 00011010 | 1 | |
| 11100110 | 00011001 | 1 | |
| 11100111 | 00011000 | 1 | |
| 11101000 | 11101000 | 0 | 10100001 |
| 11101001 | 00010110 | 1 | |

MEMORY SYSTEM

CROSS-REFERENCE TO RELATED APPLICATION

This application is based upon and claims the benefit of priority from Japanese Patent Application No. 2022-000487, filed Jan. 5, 2022, the entire contents of which are incorporated herein by reference.

FIELD

Embodiments described herein relate generally to a memory system.

BACKGROUND

A memory system includes a nonvolatile memory such as a NAND-type flash memory and a controller that can communicate with a host and control the nonvolatile memory.

DESCRIPTION OF THE DRAWINGS

FIG. 5 is an example of a conversion table from first data to second data and third data of the memory system according to the first embodiment.

FIGS. 6A to 6C are examples of conversion tables from the second data to the third data of the memory system according to the first embodiment.

FIGS. 7A to 7C are tables showing the numbers of 1's provided in each bit of the first data, the second data, and the third data of the memory system according to the first embodiment.

FIGS. 8A to 8C are other examples of the conversion tables from the first data to the second data and from the second data to the third data of the memory system according to the first embodiment.

DETAILED DESCRIPTION

Figure 1:
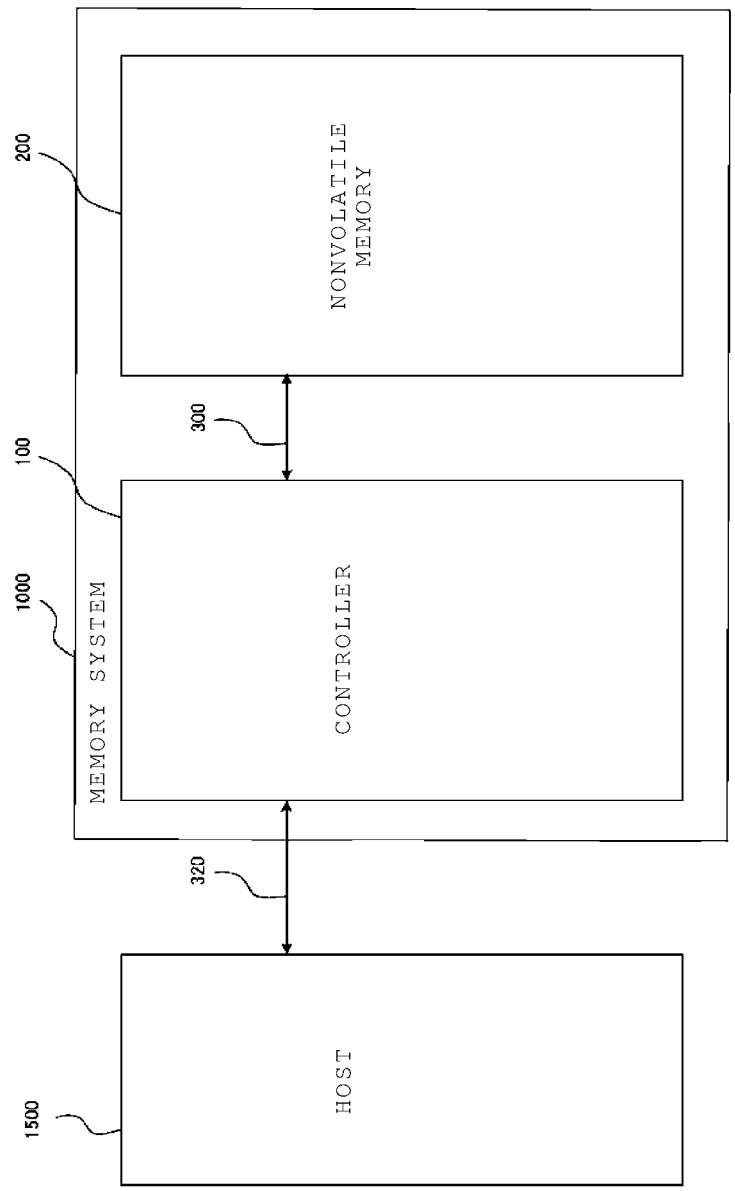
FIG. 1 is a block diagram illustrating an overall configuration example of a memory system connected to a host device according to a first embodiment.

Embodiments provide a memory system that reduces power consumption and improves the quality of data transmitted between a controller and a nonvolatile memory.

In general, according to one embodiment, a memory system includes a nonvolatile memory, a memory bus that includes a plurality of data lines, and a controller that includes an encoder configured to encode a first group of data including a plurality of first data, each first data having a plurality of bits, and is configured to transmit the encoded first group of data to the nonvolatile memory via the data lines. The encoder is configured to perform a first encoding process of generating a second group of data including a plurality of second data from the plurality of first data in the first group, and a second encoding process of generating a third group of data including a plurality of third data from the plurality of second data in the second group. In the first encoding process, for each first data in the first group, if the number of bits of the first data having a first logical value is greater than or equal to the number of bits of the first data having a second logical value, each bit of the second data has the same logical value as a corresponding bit of the first data, and if the number of bits of the first data having the first logical value is less than the number of bits of the first data having the second logical value, each bit of the second data has an inverted logical value of the corresponding bit of the first data. The second logical value is less likely to be the value in an n-th bit position of the plurality of third data in the third group than the value in any of the bit positions of the plurality of second data in the second group.

Hereinafter, embodiments are described with reference to the drawings. In the following description, components having the same function and configuration are denoted by the same reference numerals. In addition, each of the embodiments provided below is given as an example of devices and methods for implementing the technical idea of the present embodiment, and materials, shapes, structures, arrangements, and the like of the components are not limited to those described below.

Each functional block may be implemented by any one of hardware and computer software, or a combination of both. For this reason, the functional blocks are generally described in terms of the functionality thereof so that it is clear that each functional block is any of these. It is not essential that each functional block be implemented as in the following examples. For example, some functions may be performed by a functional block different from the functional block described below. Further, the functional block described below may be divided into smaller functional subblocks.

First Embodiment

1.1. Overall Configuration

FIG. 1 is a block diagram illustrating an overall configuration example of a memory system 1000 connected to a host device according to the present embodiment. As illustrated in FIG. 1, the memory system 1000 includes a configuration in which a controller 100 and a nonvolatile memory 200 are connected to each other via a memory bus 300. The memory system 1000 is connected to a host device 1500 via a communication interface 320 and functions as an external storage device of the host device 1500.

The memory system 1000 may be a memory card in which the controller 100 and the nonvolatile memory 200 are configured in one package and may be a solid-state drive (SSD).

For example, the host device 1500 may be an information processing device such as a personal computer, a mobile phone, or an image capturing device, a mobile terminal such as a tablet computer or a smartphone, a game device, and an in-vehicle terminal such as a car navigation system.

The communication interface 320 connects the memory system 1000 and the host device 1500. The communication interface 320 conforms, for example, to Serial Advanced Technology Attachment (SATA), Serial Attached SCSI (SAS), Peripheral Components Interconnect Express (PCIe®), and Non-Volatile Memory Express (NVMe®).

The controller 100 controls the nonvolatile memory 200 for writing and reading data according to the request from the host device 1500. According to the present embodiment, the request is, for example, an instruction or a command. The controller 100 is a semiconductor integrated circuit configured as system-on-a-chip (SoC), field-programmable gate array (FPGA), and application-specific integrated circuit (ASIC). A portion or all of the functions of each component of the controller 100 describe below may be implemented by a central processing unit (CPU) executing firmware or may be implemented by hardware.

The nonvolatile memory 200 is a semiconductor memory that can store data in a nonvolatile manner. The nonvolatile memory 200 is, for example, a NAND-type flash memory. In the NAND-type flash memory, data is written and read in page units. Further, in the NAND-type flash memory, data is erased in block units. If the NAND-type flash memory is used for the nonvolatile memory 200, the memory cell may be a single-level cell that can store 1 bit, or may be a multi-level cell that can store 2 bits or more. In the NAND-type flash memory, the write data is randomized, and the concentration of a particular data pattern is prevented. The memory system according to the present embodiment is particularly effective in a nonvolatile memory (for example, NAND-type flash memory) in which write data is randomized.

In the present embodiment, an example in which a NAND-type flash memory is used as the nonvolatile memory 200 is described, but as the nonvolatile memory 200, a three-dimensional structure flash memory, a storage unit other than the NAND-type flash memory such as a resistance random access memory (ReRAM), a ferroelectric random access memory (FeRAM), a magnetoresistive random access memory (MRAM) may be used. The NAND-type flash memory is, for example, a NAND-type flash memory chip.

Figure 2:
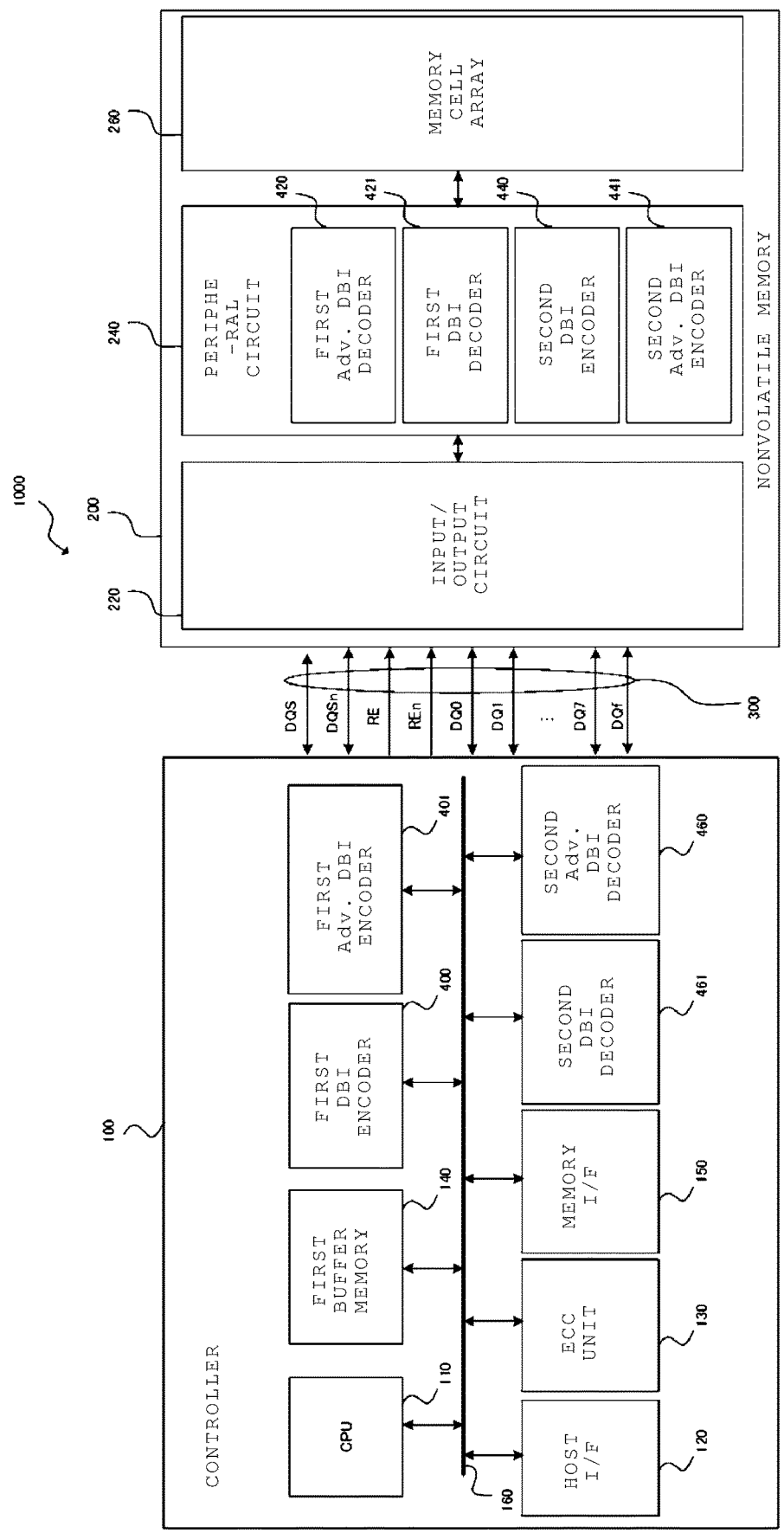
FIG. 2 is a block diagram illustrating a configuration example of a controller and a nonvolatile memory of the memory system according to the first embodiment.

FIG. 2 is a block diagram illustrating a configuration example of the controller 100 and the nonvolatile memory 200 of the memory system 1000 according to the present embodiment.

Each configuration of the controller 100 is described. As illustrated in FIG. 2, the controller 100 includes a configuration in which a CPU 110, a host interface (host I/F) 120, an error check and correction (ECC) unit 130, a first buffer memory 140, a memory interface (memory I/F) 150, a first data bus inversion (DBI) encoder 400, a first advanced (Adv.) DBI encoder 401, a second Adv. DBI decoder 460, and a second DBI decoder 461 are connected to each other via an internal bus 160.

According to the present embodiment, described will be a case in which the controller 100 includes the first DBI encoder 400, the first Adv. DBI encoder 401, the second Adv. DBI decoder 460, and the second DBI decoder 461. Alternatively, any one thereof may be present outside the controller 100, and the others may be present in the controller 100, or all may be present outside the controller 100.

The CPU 110 controls each component of the memory system 1000. When the memory system 1000 is started, the CPU 110 reads firmware (e.g., control program) stored in the ROM (not illustrated) to the first buffer memory 140 or a RAM (not illustrated). Thereafter, each function is implemented by the CPU 110 executing firmware.

If a request is received from the host device 1500 via the host interface 120, the CPU 110 controls each unit of the controller 100 according to this request. For example, the CPU 110 instructs the memory interface 150 to write data to the nonvolatile memory 200 according to a write request from the host device 1500. In addition, the CPU 110 instructs the memory interface 150 to read data from the nonvolatile memory 200 according to a read request from the host device 1500.

In addition, if the CPU 110 receives a write request from the host device 1500, the data designated by the write request is stored in the first buffer memory 140, and a storage area in the nonvolatile memory 200 with respect to this data is determined. That is, the CPU 110 determines and manages the writing destination of the data. The correspondence between the logical address of the data received from the host device 1500 and the physical address indicating the storage area in the nonvolatile memory 200 where the corresponding data is stored, is stored, for example, in the first buffer memory 140, as the address conversion table.

In addition, if the read request is received from the host device 1500, the CPU 110 converts the logical address designated by the read request to the physical address of the nonvolatile memory 200 by using the above address conversion table and instructs the memory interface 150 to read data from the corresponding physical address. Accordingly, the data read from the nonvolatile memory 200 is temporarily stored in the first buffer memory 140 and then transmitted to the host device 1500 via the host interface 120.

The host interface 120 outputs the request, the write data, or the like received from the host device 1500 to the internal bus 160 and stores the request, the write data, or the like in the first buffer memory 140. In addition, the host interface 120 transmits the read data read from the nonvolatile memory 200 and stored in the first buffer memory 140, the response from the CPU 110, and the like to the host device 1500.

The ECC unit 130 is an encoding and decoding circuit, for example, having an error correction function, and encodes data to be written to the nonvolatile memory 200 into an error correction code such as a Bose Chaudhuri Hocquenghem (BCH) code. In addition, the error in the data read from the nonvolatile memory 200 is corrected by the ECC unit 130 using this code.

The data received as the write data from the host device 1500 by the host interface 120 is temporarily stored in the first buffer memory 140. The CPU 110 determines the storage area of the nonvolatile memory 200 for the data stored in the first buffer memory 140 and instructs the memory interface 150 to write the data in the determined storage area.

For the first buffer memory 140, for example, a volatile memory such as a dynamic random access memory (DRAM) and a static random access memory (SRAM) may be used. In addition, the first buffer memory 140 may be mounted in the controller 100 as depicted or may be mounted outside the controller 100.

The memory interface 150 controls a process of writing data to the nonvolatile memory 200, a process of reading data from the nonvolatile memory 200, and the like based on the instruction from the CPU 110.

The memory interface 150 transmits the write data received from the first buffer memory 140 and the like to the nonvolatile memory 200 via the first DBI encoder 400 and the first Adv. DBI encoder 401 based on the instruction from the CPU 110. In addition, the read data received from the nonvolatile memory 200 is transmitted to the first buffer memory 140 via the second Adv. DBI decoder 460 and the second DBI decoder 461.

The internal bus 160 is a communication line that connects the CPU 110, the host interface 120, the ECC unit 130, the first buffer memory 140, the memory interface 150, the first DBI encoder 400, the first Adv. DBI encoder 401, the second Adv. DBI decoder 460, and the second DBI decoder 461 to each other.

Details of the first DBI encoder 400 and the first Adv. DBI encoder 401 are described in "1.2.2. Write Operation (Encoding)" below. Details of the second Adv. DBI decoder 460 and the second DBI decoder 461 are described in "1.2.5. Read Operation (Decoding)" below.

As further illustrated in FIG. 2, the nonvolatile memory 200 includes an input and output circuit 220, a peripheral circuit 240, and a memory cell array 260.

The input and output circuit 220 is connected to the memory interface 150 of the controller 100 via the memory bus 300. The input and output circuit 220 receives a plurality of control signals from the controller 100 via the memory bus 300 and supplies various internal control signals to the peripheral circuit 240 based on the received control signals.

The input and output circuit 220 receives the write data from the controller 100 and supplies the received write data to the peripheral circuit 240. In addition, the input and output circuit 220 receives data stored in a cell transistor of the memory cell array 260 from the peripheral circuit 240 and supplies the received data to the controller 100 via the memory bus 300.

The peripheral circuit 240 includes a first Adv. DBI decoder 420, a first DBI decoder 421, a second DBI encoder 440, a second Adv. DBI encoder 441, a sequencer (not illustrated), a driver (not illustrated), a sense amplifier (not illustrated), a row decoder (not illustrated), and the like. The peripheral circuit 240 receives various signals from the input and output circuit 220 and writes data to the cell transistor of the memory cell array 260 based on received signals. In addition, the peripheral circuit 240 reads data stored in the cell transistor of the memory cell array 260.

The peripheral circuit 240 writes the write data and the like received from the input and output circuit 220 to the memory cell array 260 via the first Adv. DBI decoder 420 and the first DBI decoder 421 and transmits the read data and the like received from the memory cell array 260 to the input and output circuit 220 via the second DBI encoder 440 and the second Adv. DBI encoder 441.

Details of the first Adv. DBI decoder 420 and the first DBI decoder 421 are described in "1.2.3. Write Operation (Decoding)" described below. Details of the second DBI encoder 440 and the second Adv. DBI encoder 441 are described in "1.2.4. Read Operation (Encoding)" described below.

The memory cell array 260 receives data from the peripheral circuit 240 during the writing and stores the received data in the cell transistor. In addition, the memory cell array 260 supplies the data stored in the cell transistor in the peripheral circuit 240 during the reading.

1.2. Operation 1.2.1. Entire Operation

Figure 3:
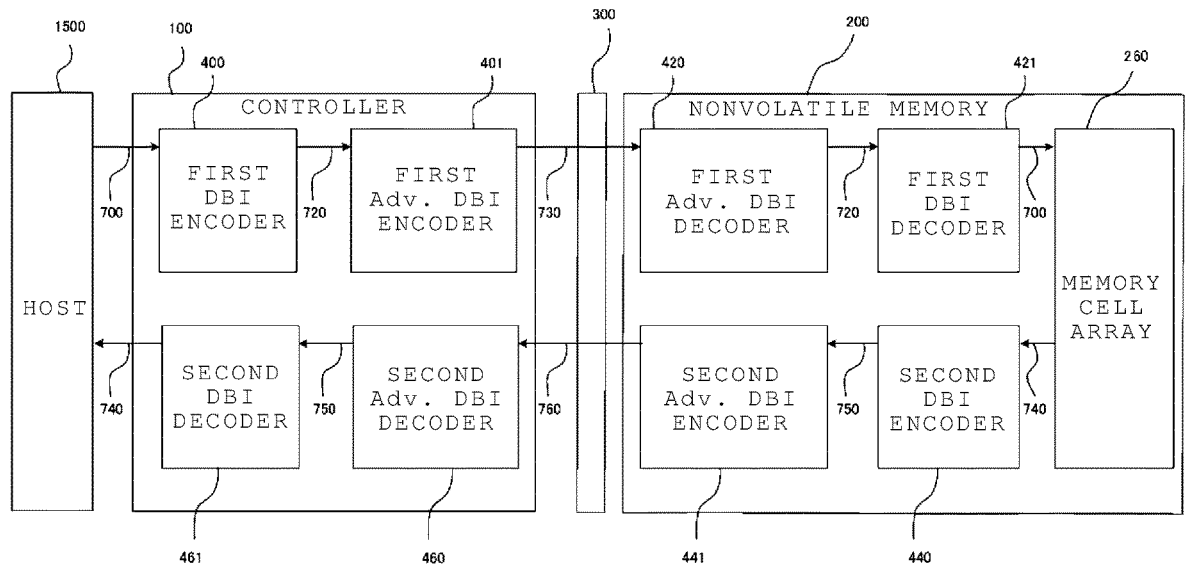
FIG. 3 is a block diagram illustrating an entire operation of the memory system according to the first embodiment.

FIG. 3 is a block diagram illustrating an example of the encoding and decoding of the data performed by the memory system 1000 according to the present embodiment.

If the data is written to the nonvolatile memory from the host device 1500, the host device 1500 transmits the write data to the controller 100 as the first data 700. The first data 700 is encoded into second data 720 by the first DBI encoder 400 in the controller 100.

Subsequently, the second data 720 is encoded into third data 730 by the first Adv. DBI encoder 401 in the controller 100. The third data 730 is transmitted to the nonvolatile memory 200 via the memory bus 300.

Subsequently, the third data 730 is decoded into the second data 720 by the first Adv. DBI decoder 420 in the nonvolatile memory 200. The second data 720 is decoded into the first data 700 by the first DBI decoder 421 in the nonvolatile memory. The first data 700 is written to the nonvolatile memory 200.

If the data is read from the nonvolatile memory 200 to the host device 1500, fourth data 740 read from the nonvolatile memory 200 is encoded into fifth data 750 by the second DBI encoder 440 in the nonvolatile memory 200.

Subsequently, the fifth data 750 is encoded into sixth data 760 by the second Adv. DBI encoder 441 in the nonvolatile memory 200. The sixth data 760 is transmitted to the controller 100 via the memory bus 300.

Subsequently, the sixth data 760 is decoded into the fifth data 750 by the second Adv. DBI decoder 460 in the controller 100. The fifth data 750 is decoded into the fourth data 740 by the second DBI decoder 461 in the controller 100. The fourth data 740 is sent to the host device 1500.

The memory bus 300 connects the controller 100 and the nonvolatile memory 200 to each other. The memory interface 150 and the input and output circuit 220 transmit or receive the data via the memory bus 300 (FIG. 2). The memory bus 300 conforms, for example, to a toggle double data rate (DDR) standard and an open NAND flash interface (ONFI) standard. The memory bus 300 transmits or receives, for example, signals DQ, DQS, DQSn, RE, REn, and DQf. The memory bus 300 is referred to as a data bus. If the signal name is suffixed with "n", the signal is negative logic. That is, the suffix indicates that the signal is asserted when it is at the "L (Low)" level. The memory bus 300 includes data lines DQ0 to DQ7.

The signals DQ (DQ0 to DQ7) have, for example, a width of 8 bits, and include a command, the write data to the nonvolatile memory 200 or the read data from the nonvolatile memory 200, an address, a status, and the like. The signal DQf has the width of 1 bit and indicates a flag.

During the writing of data to the memory cell array 260 in the nonvolatile memory 200, the first data 700 received by the host interface 120 is encoded by the first DBI encoder 400 and the first Adv. DBI encoder 401 and is input to the input and output circuit 220 of the nonvolatile memory 200 as the third data 730 (=the signals DQ0 to DQ7 and DQf) via the memory bus 300. The third data 730 input to the input and output circuit 220 is transmitted to the peripheral circuit 240 and decoded into the first data 700 by the first Adv. DBI decoder 420 and the first DBI decoder 421 and is written to the memory cell array 260.

During the reading of data, the fourth data 740 written to the memory cell array 260 is encoded as the sixth data 760 by the second DBI encoder 440 and the second Adv. DBI encoder 441. This sixth data 760 is transmitted to the controller 100 via the memory bus 300 (=the signals DQ0 to DQ7 and DQf) and decoded into the fourth data 740 by the second Adv. DBI decoder 460 and the second DBI decoder 461. The fourth data 740 could be the same as the first data 700 received by the host interface 120. In this case, the bit lengths of the first data 700 and the fourth data 740 are the same.

The signals DQS and DQSn are synchronization signals bidirectionally exchanged between the controller 100 and the nonvolatile memory 200. The signals DQS and DQSn from the controller 100 toward the nonvolatile memory 200 instructs the nonvolatile memory 200 on the timing of capturing the signals DQ.

Meanwhile, the signals DQS and DQSn from the nonvolatile memory 200 to the controller 100 instruct the controller 100 on the timing of capturing the signals DQ.

During the reading the data, the signals RE and REn from the controller 100 to the nonvolatile memory 200 instruct the nonvolatile memory 200 to output the signals DQ. In addition, the nonvolatile memory 200 that receives the signals RE and REn generate the signals DQS and DQSn so as to be synchronized with the signals DQ output according to the signals RE and REn. In case of being instructed to output the sixth data 760 to the signals DQ, the memory interface 150 sets the output number instructed by the signals RE and REn to the number corresponding to the number of the timings instructed by the signals DQS and DQSn.

1.2.2. Write Operation (Encoding)

Figure 4:
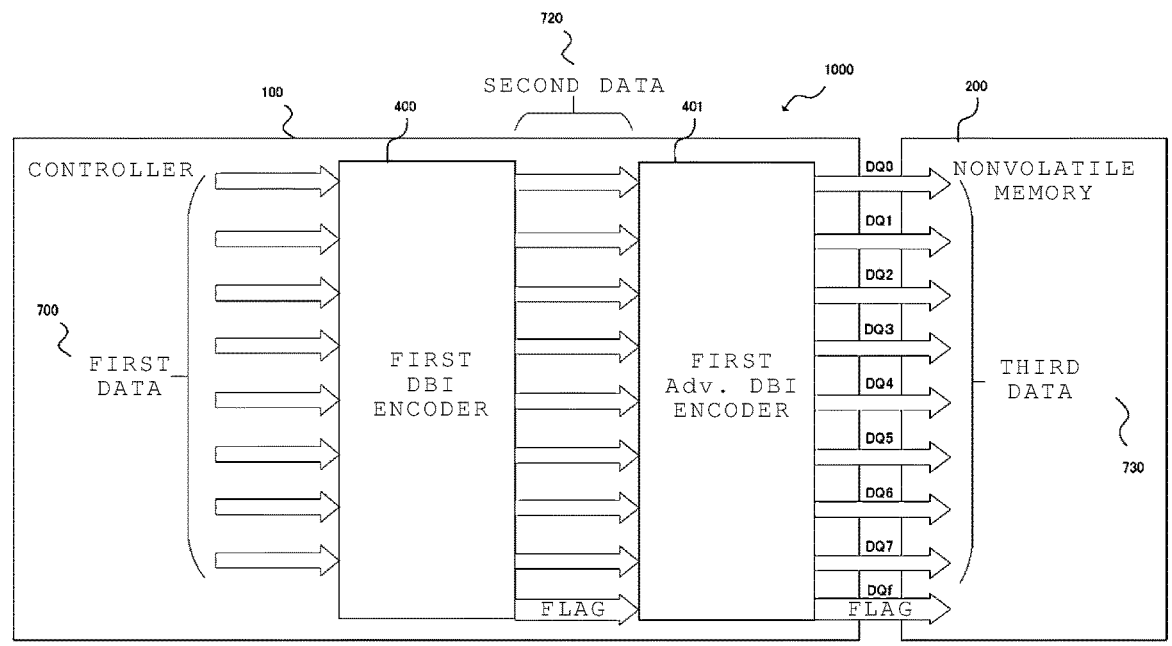
FIG. 4 is a block diagram illustrating an example of encoding during a write operation of the memory system according to the first embodiment.

FIG. 4 is a block diagram illustrating an example of encoding from the first data 700 to the second data 720 by the first DBI encoder 400 of the memory system 1000 according to the present embodiment and encoding from the second data 720 to the third data 730 by the first Adv. DBI encoder 401. In addition, the encoding from the first data 700 to the second data 720 is also referred to as conversion from the first data 700 to the second data 720. The encoding from the second data 720 to the third data 730 is referred to as conversion from the second data 720 to the third data 730.

As illustrated in FIG. 4, the first DBI encoder 400 encodes the first data 700 having the first bit width to the second data 720. The second data 720 has a first bit width. As described below with reference to FIGS. 5, 6A to 6C, and 7A to 7C, the number of 1's provided in the second data 720 is encoded to be equal to or less than the number of 1's provided in the first data 700 (for easier description, FIGS. 5, 6A to 6C, and 7A to 7C are illustrated with 4 bits). A flag is added to the second data 720. The flag has a second bit width. For example, the first bit width is 8 bits, and the second bit width is 1 bit.

The first Adv. DBI encoder 401 encodes the second data 720 having the first bit width into the third data 730. A flag is added to the third data 730. The third data 730 has the first bit width. As described below with reference to FIGS. 5, 6A to 6C, and 7A to 7C, the number of 1's provided in a group of the third data 730 is encoded so that there is a bias for each bit, as compared with the number of 1's provided in a group of the second data 720.

In addition, the first data 700 having the number of bits in accordance with the width of the signal DQ described below is encoded into the second data 720 by the first DBI encoder 400. Further, the second data 720 is encoded into the third data 730 by the second DBI encoder 440. FIG. 4 illustrates a case in which the first data 700 has the width of 8 bits, and the first data 700 are encoded into the second data 720 by the first DBI encoder 400.

According to the present embodiment, the first data 700 encoded by the first DBI encoder 400 is write data from the controller 100 to the nonvolatile memory 200. In addition, the first data 700 is not limited to the data received as the write data from the host device 1500 and may be data used for internal processing such as garbage collection (also referred to as "compaction"), wear leveling, and refresh.

The first DBI encoder 400 includes a second buffer memory (not illustrated) that temporarily stores the first data 700 received from the first buffer memory 140. For example, a volatile memory such as a static random access memory (SRAM) or a register may be used for the second buffer memory. The first data 700 stored in the second buffer memory is encoded into the second data 720 by the first DBI encoder 400 and is transmitted to the first Adv. DBI encoder 401. The first Adv. DBI encoder 401 includes a third buffer memory (not illustrated) that temporarily stores the second data 720 received from the first DBI encoder 400. A volatile memory such as a SRAM or a register may be used for the third buffer memory. The second data 720 stored in the third buffer memory is encoded into the third data 730 by the first Adv. DBI encoder 401. Flags described below are added to the second data 720 and the third data 730. The third data 730 and the flag are transmitted from the second buffer memory to the nonvolatile memory 200 by the memory interface 150. In addition, in addition to DQ0 to DQ7 that transmit data, DQf for transmitting the flag is provided in the internal bus 160 and the memory bus 300.

Furthermore, the encoding of the transmitted data is described. In addition, for easier description, FIGS. 5, 6A to 6C, and 7A to 7C illustrate the data to be transmitted is 4 bits.

The tables of first data of FIGS. 5 and 6A to 6C are tables of data to be transmitted from the controller to the nonvolatile memory. The table of the second data is a table for encoding the first data to the second data during the DBI process. The table of the third data is a table for encoding the second data into the third data during an Adv. DBI process.

FIGS. 5 and 6A to 6C are examples of the conversion table from the first data 700 to the second data 720 and the conversion table from the second data 720 to the third data 730 of the memory system 1000 according to the first embodiment. FIG. 7A is a table of counting the number of 1's in a group of the first data 700 for each bit. FIG. 7B is a table of counting the number of 1's in the group of the second data 720 for each bit. FIG. 7C is a table of counting the number of 1's in the group of the third data 730 for each bit. In FIGS. 5, 6A to 6C, and 7A to 7C, the logical value having the more power consumption is "1". In FIG. 6A to 6C, a focus is brought to the number of "1", but in case of using "1" in an inverted manner, the logical value having the more power consumption is "0", and attention may be paid to the number of "0". The present embodiment may be implemented when the logical value having the more power consumption is "1" or "0".

For example, in FIGS. 5 and 6A to 6C, the first data is subjected to the DBI process to be encoded into the second data, among the data of 4 bits, 0 and 1 are necessarily inverted in data having three or more 1's. That is, among the bits provided in the first data, if bits more than a half are 1, 0 and 1 are necessarily inverted. As illustrated in FIGS. 7A and 7B, the number of 1's in the group of the second data 720 becomes less than the number of 1's in the group of the first data 700 by the DBI process.

In FIG. 5, the table of the group of the third data 730 is obtained by the Adv. DBI process of the group of the second data 720. In the group of the second data 720, data A, B, C, D, E, F, G, I, J, K, and M that have the flag value of 0 is set as data A, B, C, D, E, F, G, I, J, K, and M of the table of the group of the third data 730. In the group of the third data 730, data A, B, C, D, E, F, G, I, J, K, and M are renumbered with new binary numbers each increasing by 1 from the top to the bottom. Subsequently, in the group of the second data 720, the data H, L, N, O, and P that have the flag value of 1, are given a flag of the value of 1. The new value of each item of third data 730 having the flag value of 1 is the same as renumbered third data 730 of the item that had the same value before renumbering. For example, 1-3 before renumbering was 1-2, which had a value of "1000" (i.e., the same value as H-2). Therefore, the new value of H-3 having the flag value of 1 is the same as the value of I-3 because I-3 before renumbering (i.e., I-2) had the same value as H-2.

As illustrated in FIGS. 7B and 7C, if the second data is encoded into the third data by the Adv. DBI process, the number of 1's of bit 3 of the third data becomes less than the number of 1's of bit 3 of the first and second data.

A specific example will be described in which the first data 700, the second data 720, and the third data 730 each having a bit width of 4 bits are encoded. If first data 700A is subjected to the DBI conversion, second data 720A is obtained. If the second data 720A is subjected to the Adv. DBI conversion, third data 730A is obtained.

For example, by using the conversion table of FIG. 5, "0111" of 4 bits of H-1 of the first data 700 is encoded into "1000" of H-2 of the second data 720, and a flag of a value of 1 is added. In another example, "1011" of 4 bits of L-1 of the first data 700 is encoded into "0100" of L-2 of the second data 720, and a flag of a value of 1 is added. The same applies to the other cases, but in all cases, in the first data 700, data of which the number of 1's is three or more is encoded so that 0 and 1 are necessarily inverted and thus the number of 1's of the second data 720 becomes small. A flag of the value of 1 are added to the second data 720 in which 0 and 1 are inverted, and a flag of the value of 0 is added to the second data 720 in which 0 and 1 are not inverted. In addition, when the first data 700 and the second data 720 do not have the bit width of 4 bits, the same encoding is performed.

For example, "0000" of 4 bits of A-2 of the second data 720 is encoded into "0000" of A-3 of the third data 730. The flag of the value of 0 is inherited from the second data 720. For example, "0100" of 4 bits of L-2 of the second data 720 is encoded into "0100" of L-3 of the third data 730. The flag of the value of 1 is inherited from the second data 720. In another example, "1100" of 4 bits of M-2 of the second data 720 is encoded into "1010" of M-3 of the third data 730. The flag of the value of 0 is inherited from the second data 720. The same applies to the other cases, but in all cases, the flag of the second data 720 is inherited to the third data 730.

A method of generating a conversion table of the third data 730 is described. When the second data 720 is converted into the third data 730, first, flag information (in FIG. 5) of the second data 720 is referred to, as illustrated in FIG. 6A. In the second data, though the flag is different, two items of data having the same value is present. As illustrated in FIG. 6B, in this data, new binary numbers are assigned to data into which the flags of the value of 0 is added. This binary numbers are assigned in ascending order. For example, in columns of the flags of the value of "0" in the second data 720, "1000" (in FIG. 5, I-2) is replaced with "0111" (in FIG. 6(B), I-3) in the third data 730. As illustrated in FIG. 6C, same binary numbers as the binary numbers assigned to the data to which the flags of the value of 0 are added, are assigned to the data to which the flags of the value of 1 are added, among the two items of data that have same value and different flag in the second data 720. For example, H-2 "1000" (in FIG. 5) of the second data 720 of which the flag is the value of 1 is the same data as I-2 "1000" (in FIG. 5). Therefore, in the third data 730, with respect to H-3 (in FIG. 6(C)), data "0111" of the binary number that is the same as I-3 (in FIG. 6(C)) is assigned.

As illustrated in FIG. 7A, in the group of the first data 700 before the DBI process, a total number of 1's provided in bit 3 is 8. Total numbers of 1's provided in each of bit 2, bit 1, and bit 0 are also 8. As illustrated in FIG. 7B, in the group of the second data 720 subjected to the DBI process, a total number of 1's provided in bit 3 is 5. Total numbers of 1's provided in each of bit 2, bit 1, and bit 0 are also 5. In comparison with the group of the first data 700, in the group of the second data 720, the number of 1's provided in the entire data is smaller. As illustrated in FIG. 7C, in the group of the third data 730 subjected to the Adv. DBI process, a total number of 1's provided in bit 3 is 3. A total number of 1's provided in bit 2 is 6. A total number of 1's provided in bit 1 is 7. A total number of 1's provided in bit 0 is 7. In comparison with the first data, the number of 1's provided in the entire data of the group of the third data 730 is smaller. In addition, in comparison with the group of the second data 720, in the group of the third data 730, the number of 1's provided in each bit is biased. The group of the first data 700 is encoded to the group of the third data 730 in which the number of 1's is biased for each bit by the DBI process and the Adv. DBI process. The encoded third data is transmitted from the controller 100 to the nonvolatile memory 200.

Figure 9A:
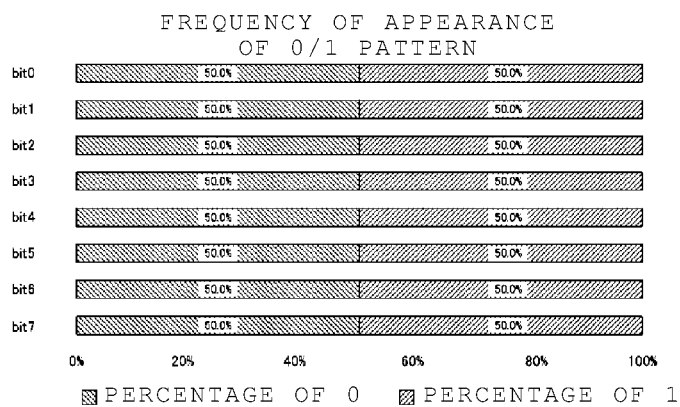
FIGS. 9A to 9C are graphs showing ratios of values of 1 and values of 0 provided in each bit of the first data, the second data, and the third data of the memory system according to the first embodiment.
Figure 9B:
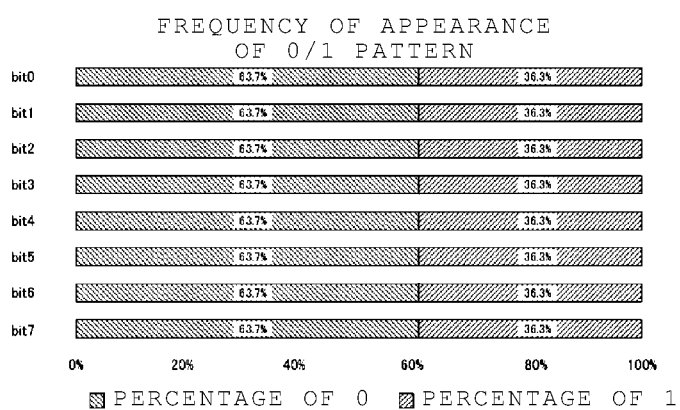
Figure 9C:
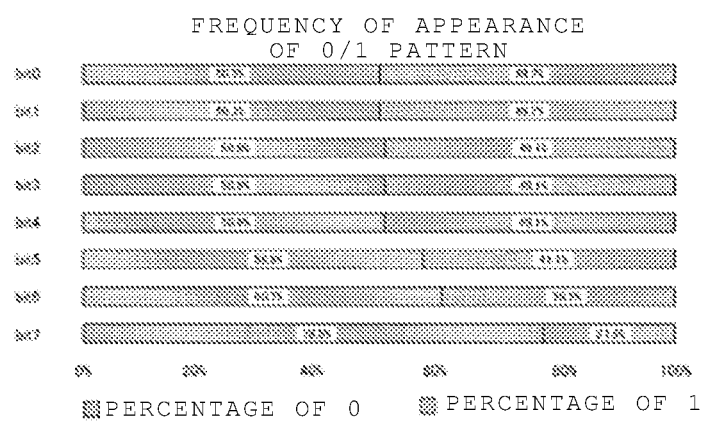

FIGS. 8A to 8C are another example of a conversion table from the first data 700 to the third data 730 of the memory system 1000 according to the first embodiment. The first data is represented by binary numbers. In FIGS. 8A to 8C, a first data group including the plurality of items of first data 700 is represented by binary numbers. FIGS. 9A to 9C are graphs illustrating ratios of 0 and 1 provided in each bit of the first data 700. Further, in FIGS. 8A to 8C and 9A to 9C, the logical value having the more power consumption is "1", and a focus is brought to the number of "1", but in case of using "1" in an inverted manner, the logical value having the more power consumption is "0", and attention may be paid to the number of "0". The present embodiment may be implemented when the logical value having the more power consumption is "1" or "0".

In FIGS. 8A to 8C, a part of 256 items of data (codes) represented by a bit width of 8 bits is described. When the first data 700 is encoded into the second data 720, in the first data 700, the data having five or more 1's is encoded so that 0 and 1 are necessarily inverted, and thus the number of 1's of the second data 720 becomes small. That is, if more than a half of the bits provided in the first data 700 are 1, 0 and 1 are necessarily inverted. A flag of the value of 1 is added to the inverted second data. A flag of the value of 0 is added to the second data that is not inverted. If the second data 720 is converted into the third data 730, first, flag information of the second data 720 is referred to. In the second data, two items of data having different flags but having the same value are present. In this data, new binary numbers are assigned to data into which the flags of the value of 0 is added. These binary numbers are assigned in ascending order. Though not illustrated, finally, binary numbers that are the same as the binary numbers assigned to the data into which the flags of the value of 0 are added are assigned, to the data into which the flags of the value of 1 are added, among the two items of data.

FIGS. 9A to 9C are graphs showing ratios of 1 and 0 in each of the first data, the second data, and the third data when data of 8 bits is converted by using the conversion tables of FIGS. 8A to 8C. As illustrated in FIG. 9A, in the group of the first data 700, the ratio of 0 for each of bit 0 to bit 7 is 50%, and the ratio of 1 is 50%. As illustrated in FIG. 9B, in the group of the second data 720, the ratio of 0 for each of bit 7 to bit 0 is 63.7%, and the ratio of 1 is 36.3%.

As illustrated in FIG. 9C, in the group of the third data 730, the ratios of 0 for bit 0 and bit 1 each are 50.3%, and the ratios of 1 each are 49.7%. The ratios of 0 for bit 2 to bit 4 each are 50.9%, and the ratios of 1 each are 49.1%. The ratio of 0 for bit 5 is 58.9%, and the ratio of 1 is 41.1%. The ratio of 0 for bit 6 is 60.7%, and the ratio of 1 is 39.3%. The ratio of 0 for bit 7 is 78.5%, and the ratio of 1 is 21.5%. In this manner, the number of 1's provided in the group of the third data 730 is encoded so that there is a bias for each bit, as compared with the number of 1's provided in a group of the second data 720.

In addition, also in the second DBI encoder 440 and the second Adv. DBI encoder 441, the encoding is performed in the same manner, by using the conversion tables of FIG. 4 or FIGS. 8A to 8C. In addition, in the first Adv. DBI decoder 420, the first DBI decoder 421, the second Adv. DBI decoder 460, and the second DBI decoder 461, decoding is performed by using the conversion tables of FIG. 5 or FIGS. 8A to 8C.

This encoding is not limited to the encoding from 8 bits to 8 bits. In addition, the conversion table is not limited to these examples. For example, the conversion table may be a conversion table for encoding data so that the ratio of 1's to 0's in bit 2 is the smallest, and may be a conversion table for encoding data so that the ratio of 1's to 0's in bit 1 is the smallest. For example, a conversion table from first data to third data is provided in an encoder, and when the first data is input to the encoder, the third data may be output without second data. These conversion tables are set before the shipping of the memory system.

In the present embodiment, the fourth data 740 encoded by the second DBI encoder 440 is data read from the memory cell array 260. The fourth data 740 may be data used for internal processing such as garbage collection, wear leveling, and refresh. In addition, the fourth data 740 may be a status of being transmitted from the nonvolatile memory 200 to the controller 100, or the like.

If the first data 700 is written to the memory cell array 260, and the first data 700 is correctly read as the fourth data 740, the bit widths of the first data 700 and the fourth data 740 are the same.

If the first data 700 is written to the memory cell array 260, and the first data 700 is correctly read as the fourth data 740, the bit widths of the third data 730 and the sixth data 760 are the same.

Figure 10:
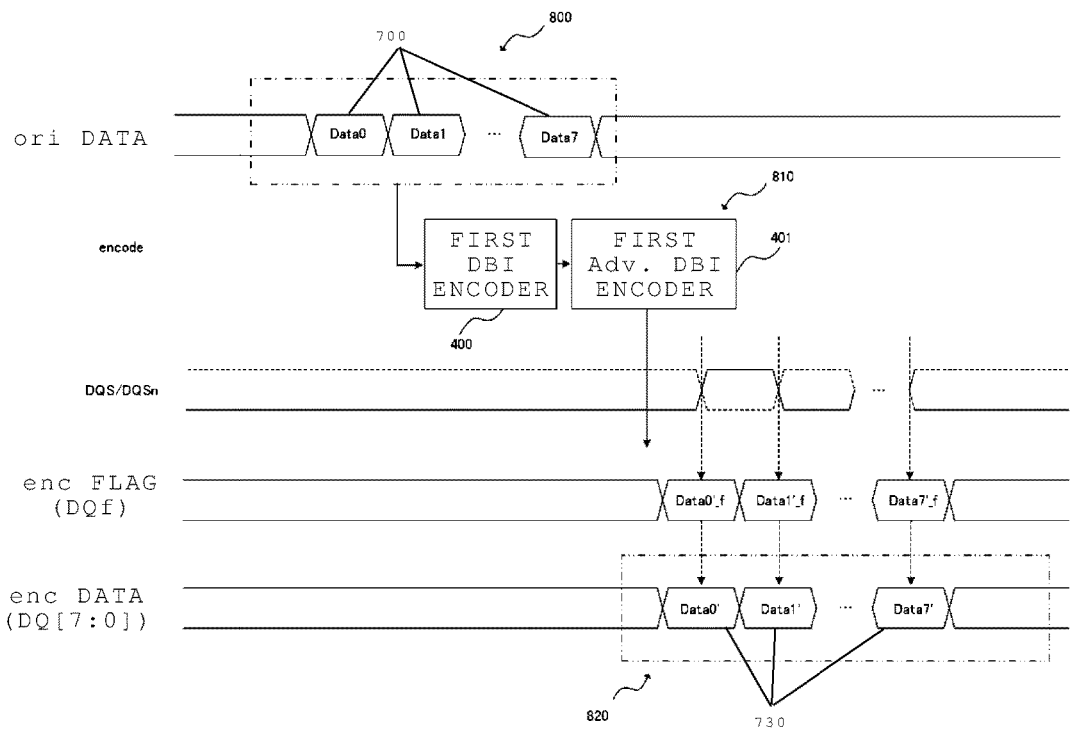
FIG. 10 is an example of a timing chart illustrating the encoding during the write operation of the memory system according to the first embodiment.

FIG. 10 is an example of a timing chart illustrating the encoding during the write operation of the memory system 1000. FIG. 10 illustrates a case in which the bit length of the first data 700 and the bit length of the third data 730 are 8 bits.

In FIG. 10, a plurality of the first data 700 each having the 8-bit length is represented by ori data. A plurality of the third data 730 each having the 8-bit length is represented by enc data. A flag having the 1-bit length is represented by an enc flag and is added to the third data 730.

As illustrated with 800 of FIG. 10, ori data is data having the 8-bit length, and includes Data 0, Data 1, . . . , and Data 7. The length of Data 0 to Data 7 are each 8-bit.

As illustrated with 820 of FIG. 10, enc data is data having the 8-bit length, and includes Data 0', Data 1', . . . , and Data 7'. Further, enc flag Data 1'_f, Data 2'_f, . . . , and Data 7'_f are flags corresponding to enc data, respectively. The length of Data 0' to Data 7' are each 8-bit.

As illustrated with 810 of FIG. 10, the ori data having the 8-bit length stored in the second buffer memory is encoded into the enc data and the enc flag by the first DBI encoder 400 and the first Adv. DBI encoder 401. The enc data is transmitted from the signals DQ[0] to DQ[7]. The enc flag is transmitted by the signal DQf.

The controller 100 outputs Data 0' to Data 7' that are enc data and Data 0'_f to Data 7'_f that are flags, as the signals DQ, and also outputs the signals DQS and DQSn to the nonvolatile memory 200.

As described above, the first data 700 is encoded into the third data 730 and transmitted from the controller 100 to the nonvolatile memory 200. In addition, the encoding from the first data 700 into the third data 730 may be performed by one encoder. In such a case, the encoder includes a conversion table from the first data 700 to the third data 730.

1.2.3. Write Operation (Decoding)

Figure 11:
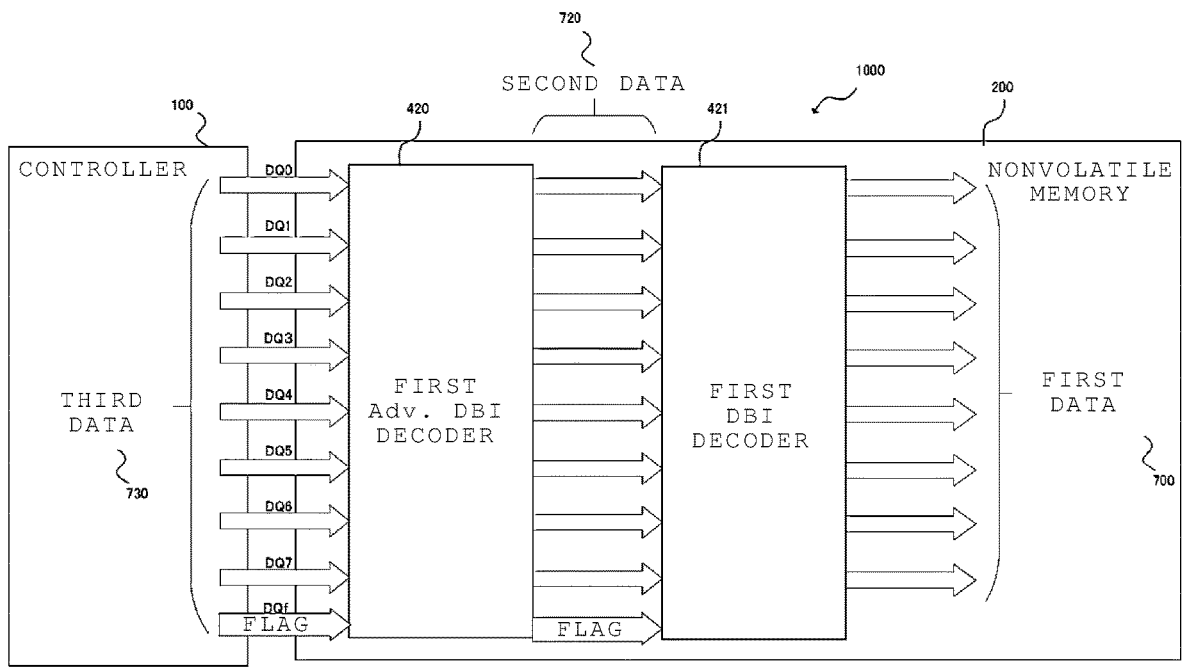
FIG. 11 is a block diagram illustrating an example of decoding during the write operation of the memory system according to the first embodiment.

FIG. 11 is a block diagram illustrating an example of decoding from the third data 730 to the first data 700 by the first Adv. DBI decoder 420 and the first DBI decoder 421 of the memory system according to the present embodiment.

As illustrated in FIG. 11, the third data 730 transmitted from the controller 100 to the nonvolatile memory 200 is decoded into the original second data 720 by the first Adv. DBI decoder 420. The second data 720 is decoded into the original first data 700 by the first DBI decoder 421. Thereafter, the decoded first data 700 is written to the memory cell array 260.

In addition, the third data 730 having the number of bits in accordance with the widths of the signals DQ described below is decoded into the first data 700 by the first Adv. DBI decoder 420 and the first DBI decoder 421. FIG. 11 illustrates a case in which the signals DQ have the widths of 8 bits, and accordingly, eight items of the third data 730 are decoded into eight items of the first data 700 by the first Adv. DBI decoder 420 and the first DBI decoder 421.

The first Adv. DBI decoder 420 includes a fourth buffer memory (not illustrated) that temporarily stores the third data 730 received from the input and output circuit 220. The third data 730 stored in the fourth buffer memory is decoded into the second data 720 by the first Adv. DBI decoder 420 and then transmitted to the first DBI decoder 421. The first DBI decoder 421 includes a fifth buffer memory (not illustrated) that temporarily stores the second data 720 received from the first Adv. DBI decoder 420. The second data 720 stored in the fifth buffer memory is decoded into the first data 700 by the first DBI decoder 421 and then is written to the memory cell array 260 by the peripheral circuit 240. For example, a volatile memory such as an SRAM or a register may be used for the fourth buffer memory and the fifth buffer memory.

Figure 12:
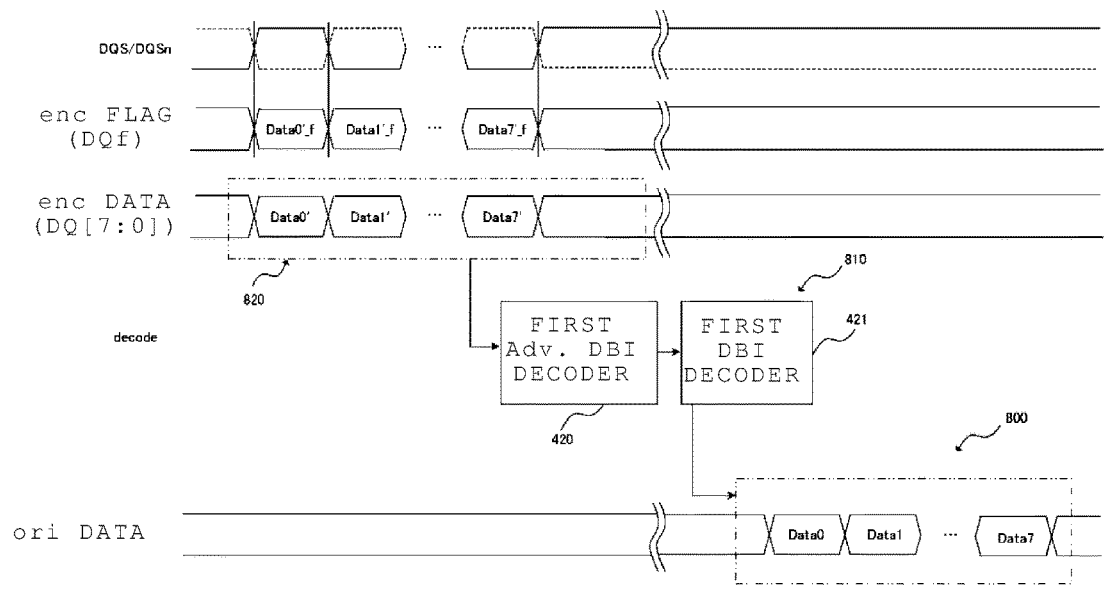
FIG. 12 is an example of a timing chart illustrating the decoding during the write operation of the memory system according to the first embodiment.

FIG. 12 is an example of a timing chart illustrating the decoding during the write operation of the memory system 1000. In addition, FIG. 12 illustrates a case in which the bit length of the first data 700 and the bit length of the third data 730 each are 8 bits.

In FIG. 12, a plurality of the first data 700 each having the 8-bit length is represented as ori data. A plurality of third data 730 each having the 8-bit length is represented as enc data. The flag having the 1-bit length is represented as an enc flag and is added to the third data.

As illustrated with 820 of FIG. 12, the enc data is data having an 8-bit length and includes Data 0'_0, Data 1', . . . , and Data 7'. In addition, enc flags Data 1'_f, Data 2'_f, . . . , Data 7'_f are flags corresponding to enc data, respectively. The length of Data 0' to Data 7' are each 8-bit.

The controller 100 outputs the enc data and the enc flags as the signals DQ and also outputs the signals DQS and DQSn to the nonvolatile memory 200.

The nonvolatile memory 200 captures the enc data and the enc flags in synchronization with the timings instructed by the signals DQS and DQSn and stores the enc data and the enc flags in the fourth buffer memory of the first Adv. DBI decoder 420.

As illustrated with 810 of FIG. 12, the enc data and the enc flag having the 8-bit lengths stored in the fourth buffer memory are decoded into the ori data having the 8-bit length by the first Adv. DBI decoder 420 and the first DBI decoder 421. The decoded ori data is written to the memory cell array 260 by the peripheral circuit 240.

As above, the controller 100 can write the data to the nonvolatile memory 200. In addition, the decoding from the third data 730 to the first data 700 may be performed by one decoder. In this case, the decoder includes a conversion table from the third data 730 to the first data 700.

1.2.4. Read Operation (Encoding)

Figure 13:
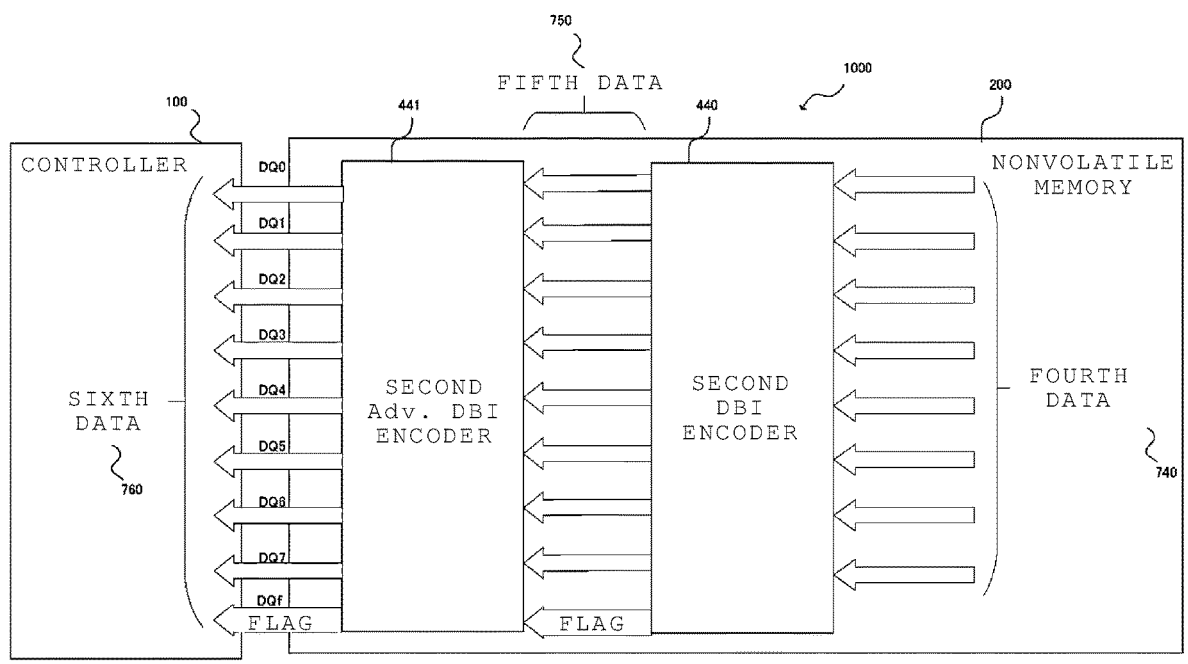
FIG. 13 is a block diagram illustrating an example of encoding during a read operation of the memory system according to the first embodiment.

Subsequently, the read operation of the memory system 1000 is described. FIG. 13 is a block diagram illustrating an example of encoding from the fourth data 740 to the sixth data 760 by the second DBI encoder 440 and the second Adv. DBI encoder 441 of the memory system 1000 according to the present embodiment.

As illustrated in FIG. 13, the second DBI encoder 440 encodes the fourth data 740 having the third bit length into the fifth data 750. A flag is added to the fifth data 750. The third bit length is, for example, 8 bits.

In addition, the fourth data 740 having the number of bits in accordance with the widths of the signals DQ described below is encoded into the sixth data 760 by the second DBI encoder 440. FIG. 13 illustrates a case in which the fourth data 740 having the width of 8 bits is encoded into the sixth data 760 having the width of 8 bits, by the second DBI encoder 440.

The second DBI encoder 440 includes a sixth buffer memory (not illustrated) that temporarily stores the fourth data 740 received from the memory cell array 260. The command that requests the reading of the fourth data 740 from the memory cell array 260 is output from the controller 100 to the nonvolatile memory 200. The fourth data 740 stored in the sixth buffer memory is encoded into the fifth data 750 by the second DBI encoder 440.

The second Adv. DBI encoder 441 includes a seventh buffer memory (not illustrated) that temporarily stores the fifth data 750 received from the second DBI encoder 440. The fifth data stored in the seventh buffer memory is encoded into the sixth data 760 by the second Adv. DBI encoder 441 and is transmitted to the controller 100 by the peripheral circuit 240.

For example, a volatile memory such as an SRAM or a register may be used for the sixth buffer memory and the seventh buffer memory.

Figure 14:
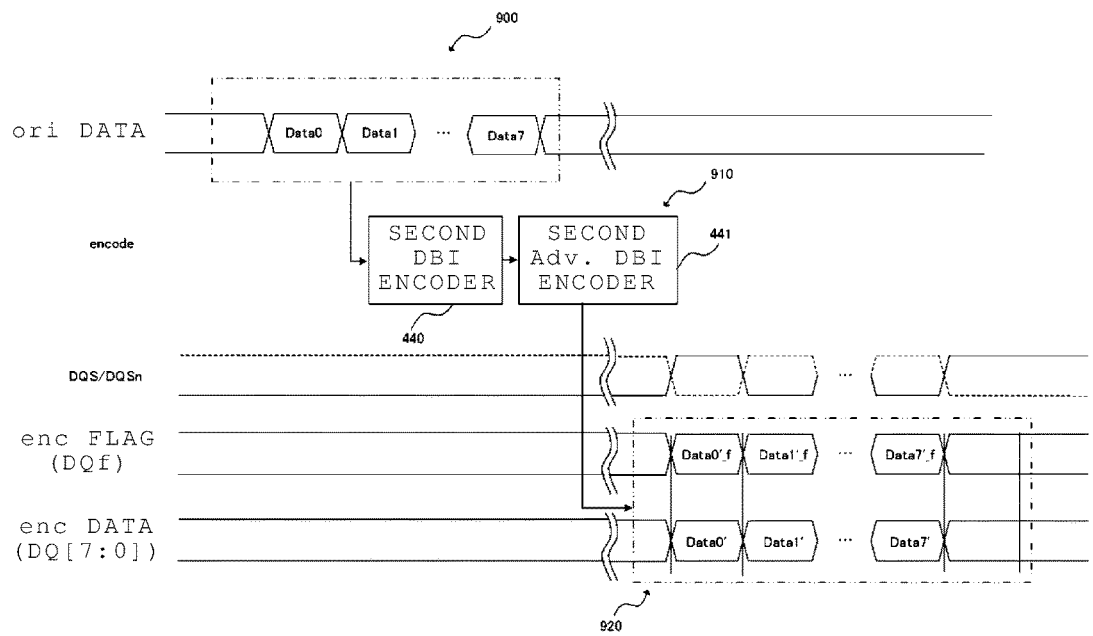
FIG. 14 is an example of a timing chart illustrating the encoding during the read operation of the memory system according to the first embodiment.

FIG. 14 is an example illustrating the timing chart illustrating the encoding during the read operation of the memory system 1000. In addition, FIG. 14 illustrates a case in which the bit length of the fourth data 740 and the bit length of the sixth data 760 each are 8 bits.

In FIG. 14, a plurality of the fourth data 740 each having the 8-bit length is represented as the ori data. A plurality of sixth data 760 each having the 8-bit length is represented as the enc data. A flag having the 1-bit length is represented as the enc flag and is added to the sixth data 760.

As illustrated in 900 of FIG. 14, the ori data includes Data 0, Data 1, . . . , and Data 7. The length of Data 0 to Data 7 are each 8-bit.

First, the controller 100 outputs a command (not illustrated) for instructing the nonvolatile memory 200 to read the ori data from the memory cell array 260. If the command is received from the controller 100, the nonvolatile memory 200 reads the ori data from the inside of the memory cell array 260. The ori data read from the memory cell array 260 is stored in the sixth buffer memory of the second DBI encoder 440 and then stored in the seventh buffer memory of the second Adv. DBI encoder 441.

By a ready or busy signal (not illustrated), the controller 100 that recognizes that the ori data is stored in the seventh buffer memory instructs the output of the enc data from the nonvolatile memory 200 to the signals DQ [7:0] by using the signals RE and REn. The enc flag is transmitted by the signal DQf. At this point, the memory interface 150 sets the number of the timings instructed by the signals RE and REn to the data length of the sixth data 760, that is, 8.

As illustrated with 910 of FIG. 14, the ori data that is the fourth data 740 having the 8-bit length stored in the sixth buffer memory is encoded into the enc data that is the sixth data 760 having the 8-bit length and the enc flag that is the flag corresponding to the enc data by the second DBI encoder 440 and the second Adv. DBI encoder 441. The enc data is transmitted by the signals DQ[0] to DQ[7], and the enc flag is transmitted by the signal DQf.

As described above, the fourth data 740 is encoded into the sixth data 760 and is transmitted from the nonvolatile memory 200 to the controller 100. Further, the encoding from the fourth data 740 to the sixth data 760 may be performed by one encoder. In this case, the encoder includes a conversion table from the fourth data 740 to the sixth data 760.

1.2.5. Read Operation (Decoding)

Figure 15:
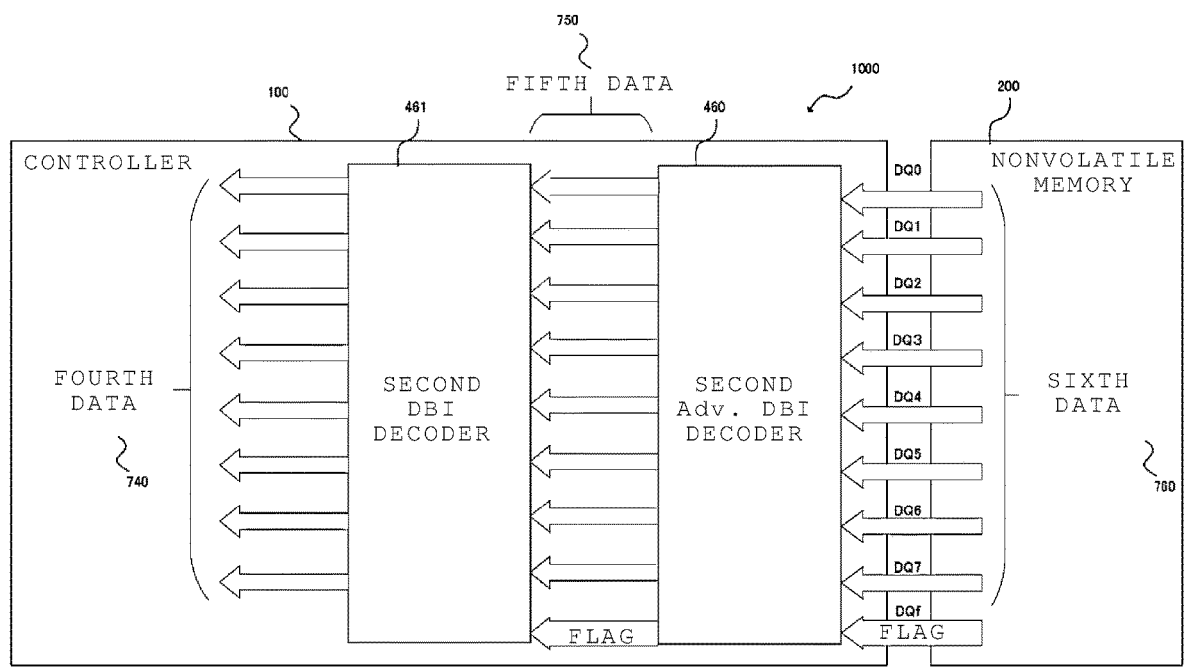
FIG. 15 is a block diagram illustrating an example of decoding during the read operation of the memory system according to the first embodiment.

FIG. 15 is a block diagram illustrating an example of decoding from the sixth data 760 to the fourth data 740 by the second Adv. DBI decoder 460 and the second DBI decoder 461 of the memory system 1000 according to the present embodiment.

Figure 16:
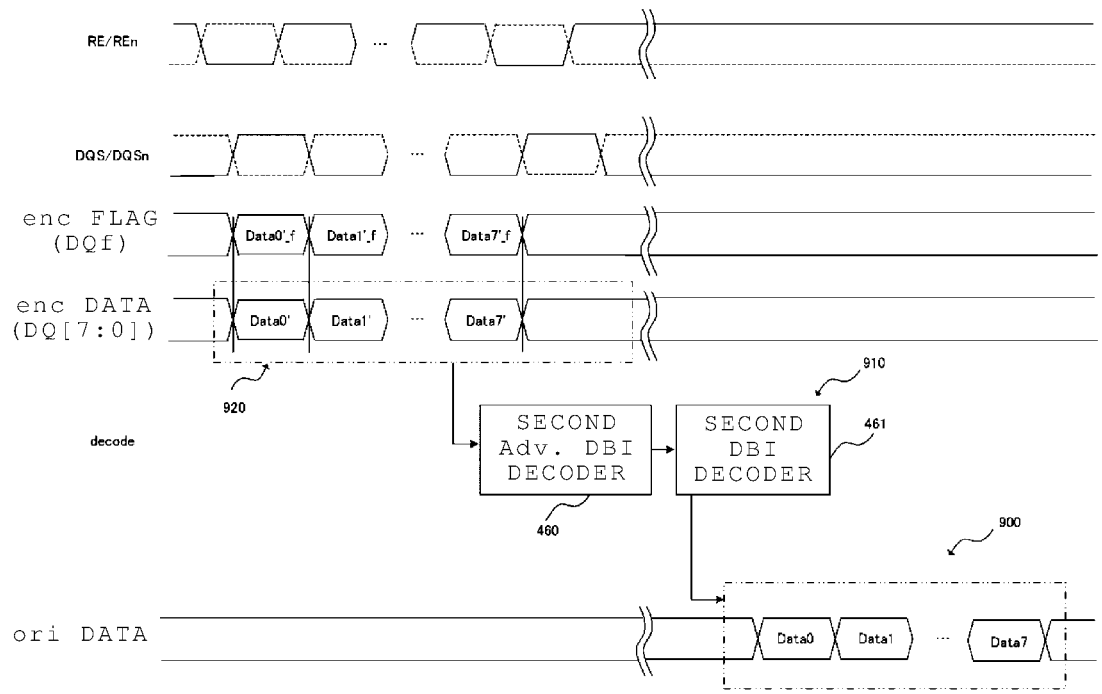
FIG. 16 is an example of a timing chart illustrating the decoding during the read operation of the memory system according to the first embodiment.

As illustrated in FIG. 15, the second Adv. DBI decoder 460 decodes the sixth data 760 encoded by the second Adv. DBI encoder 441 into the original fifth data 750. The second DBI decoder 461 decodes the fifth data 750 decoded by the second DBI decoder 460 into the fourth data 740. As illustrated in FIGS. 2 and 16, the fourth data 740 is encoded into the sixth data 760 by the second DBI encoder 440 and the second Adv. DBI encoder 441 and then transmitted from the nonvolatile memory 200 to the controller 100. Subsequently, the sixth data 760 is decoded into the original fourth data 740 by the second Adv. DBI decoder 460 and the second DBI decoder 461.

In addition, the sixth data 760 having the number of bits in accordance with the widths of the signals DQ described below is decoded into the fifth data 750 by the second Adv. DBI decoder 460, and the fifth data 750 is decoded into the fourth data 740 by the second DBI decoder 461. FIG. 15 illustrate a case in which the signals DQ each have the width of 8 bits, and accordingly, eight items of the sixth data 760 are decoded into eight items of the fourth data 740 by the second Adv. DBI decoder 460 and the second DBI decoder 461.

The second Adv. DBI decoder 460 includes an eighth buffer memory (not illustrated) that temporarily stores the sixth data 760 received from the memory interface 150. The sixth data 760 stored in the eighth buffer memory is decoded into the fifth data 750 by the second Adv. DBI decoder 460. In addition, the second DBI decoder 461 includes a ninth buffer memory (not illustrated) that temporarily stores the fifth data received from the second Adv. DBI decoder 460. The fifth data 750 stored in the ninth buffer memory is decoded into the fourth data 740 by the second DBI decoder 461 and then transmitted to the first buffer memory 140 by the memory interface 150. For example, a volatile memory such as an SRAM or a register may be used for the eighth buffer memory and the ninth buffer memory.

FIG. 16 is an example of a timing chart illustrating the decoding during the read operation of the memory system 1000. In addition, FIG. 16 illustrates a case in which the bit length of the fourth data 740 and the bit length of the sixth data 760 each are 8 bits.

In FIG. 16, a plurality of the fourth data 740 each having the 8-bit length is represented as the ori data. A plurality of sixth data 760 each having the 8-bit length is represented as the enc data. The flag having the 1-bit length is represented by the enc flag and is added to the sixth data 760.

As illustrated in 920 of FIG. 16, the enc data includes Data 0', Data 1', . . . , and Data 7'. The enc flag is a flag corresponding to the enc data and includes Data 0'_f, Data 1'_f, . . . , and Data 7'_f. The length of Data 0' to Data 7' are each 8-bit.

The nonvolatile memory 200 generates the signals DQS and DQSn according to the received signals RE and REn. The enc data and the enc flag are captured by the controller 100 in synchronization with the timing instructed by the generated signals DQS and DQSn. More specifically, the enc data and the enc flag are stored in the eighth buffer memory of the second Adv. DBI decoder 460.

As illustrated with 930 of FIG. 16, the sixth data 760 having the 8-bit length and the enc data that is the flag corresponding to the sixth data 760 that are stored in the eighth buffer memory are decoded into the ori data that is the fourth data 740 having the 8-bit length by the second Adv. DBI decoder 460 and the second DBI decoder 461. The decoded ori data is stored in the first buffer memory 140 by the memory interface 150.

In this manner, the controller 100 can read data from the nonvolatile memory 200. Further, the decoding from the sixth data 760 to the fourth data 740 may be performed by one decoder. In this case, the decoder includes a conversion table from the sixth data 760 to the fourth data 740.

1.3. Effect

According to the above first embodiment, the data is encoded so that the ratio of 1's to 0's is small, and then the data is encoded by using Adv. DBI, so that the ratio of 1's to 0's in a specific bit is reduced, and a noise can be reduced, and thus the communication quality can be improved. The noise in this case is a crosstalk noise or a switching noise. For example, among bit lines provided in the memory system 1000, if the communication quality of a specific bit line is bad, encoding is performed by using a conversion table in which data having a smaller number of 1's is assigned to this bit line, so that the communication quality during the data transmission can be improved. For example, in a certain bit line, if a crosstalk noise occurring when 1 is transmitted is larger than a crosstalk noise occurring when 0 is transmitted, the first data is converted into the third data having a smaller number of 1's than the first data and transmitted, so that the communication quality can be improved. In addition, among the third data, a bit in which the number of 1's is the least is assigned to a certain bit line, so that a switching noise is reduced so that the communication quality can be improved.

In addition, according to the above first embodiment, in the second data 720 encoded by the first DBI encoder, the number of 1's (0 when 1 is inverted) becomes less compared with the first data 700, so that the power consumption during the transmission of the second data can be reduced from the power consumption during the transmission of the first data. Further, the second data is encoded into the third data by using the Adv. DBI encoder, the number of 1's (or 0's) is biased for each bit, so that the power consumption during the transmission of the third data can become less than the power consumption during the transmission of the first data. For example, in case of a setting in which the current flows through the external load capacitance of the signal line when 1 passes through data bus, and the current does not flow through the external load capacitance of the signal line when 0 passes through data bus, by transmitting the third data in which the number of 1's is reduced, the power consumption during the transmission of the third data can be reduced compared with the power consumption during the transmission of the first data.

Second Embodiment 2.1. Overall Configuration

A memory system according to a second embodiment is basically configured in the same manner as the memory system 1000 according to the first embodiment, but there is a difference in that a selector 470 is further provided.

Figure 17:
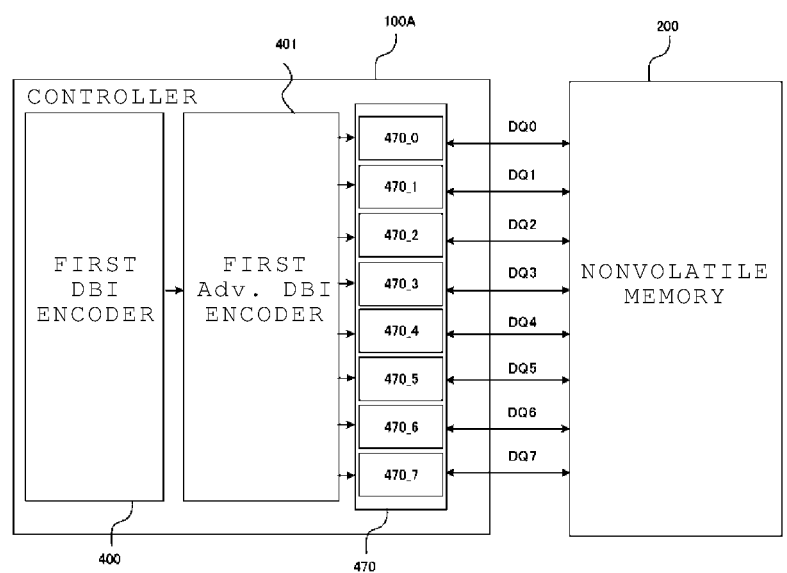
FIG. 17 is a block diagram illustrating a configuration example of a controller according to a second embodiment.

FIG. 17 is a block diagram illustrating a configuration example of a controller 100A according to the second embodiment.

The selector 470 is attached to the output of the first Adv. DBI encoder 401. The selector 470_0 is attached to the output of bit [0]. In the same manner, selectors 470_1 to 470_7 are attached to bit [1] to bit [7]. The selector 470_0 is connected to DQ0 to DQ7 of the controller 100A. The selector 470_1 is connected to DQ0 to DQ7 of the controller 100A. In the same manner, the selectors 470_2 to 470_7 are connected to DQ0 to DQ7 of the controller 100A, respectively. DQ0 to DQ7 of the controller 100A are connected to DQ0 to DQ7 of the nonvolatile memory 200, respectively.

Figure 18:
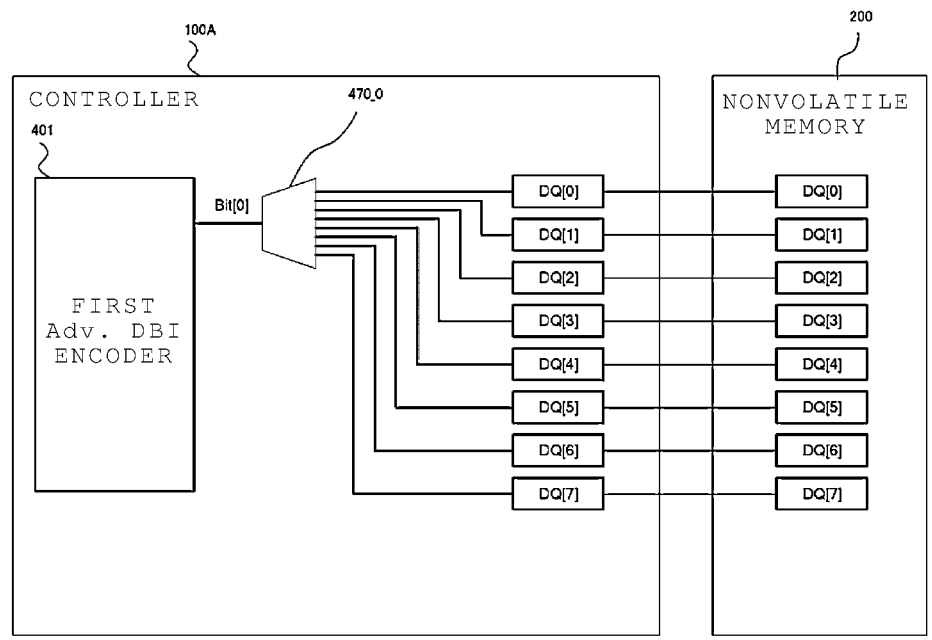
FIG. 18 is a block diagram illustrating details of a selector of the controller according to the second embodiment.

FIG. 18 is an enlarged view of the selector 470 provided in the memory system. The selector 470 is connected to each of DQ0 to DQ7 of the controller 100A.

Figure 19:
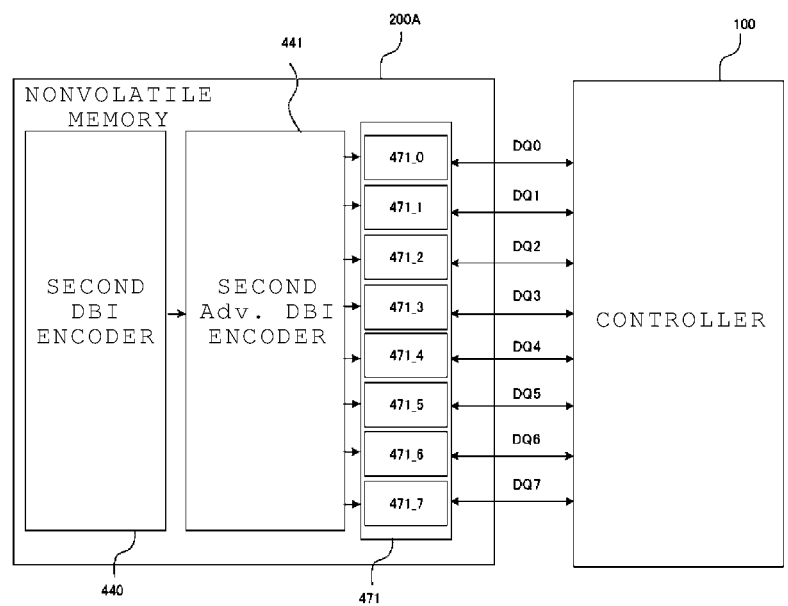
FIG. 19 is a block diagram illustrating a configuration example of a nonvolatile memory according to the second embodiment.

FIG. 19 is a block diagram illustrating a configuration example of a nonvolatile memory 200A according to the second embodiment.

The selector 471 is attached to the output of the second Adv. DBI encoder 441. A selector 471_0 is attached to the output of bit [0]. In the same manner, selectors 471_1 to 471_7 are attached to bit [1] to bit [7]. The selector 471_0 is connected to DQ0 to DQ7 of the nonvolatile memory 200A. The selector 471_1 is connected to DQ0 to DQ7 of the nonvolatile memory 200A. In the same manner, the selectors 471_2 to 471_7 are connected to DQ0 to DQ7 of the nonvolatile memory 200A, respectively. DQ0 to DQ7 of the nonvolatile memory 200A are connected to DQ0 to DQ7 of the controller 100, respectively.

Figure 20:
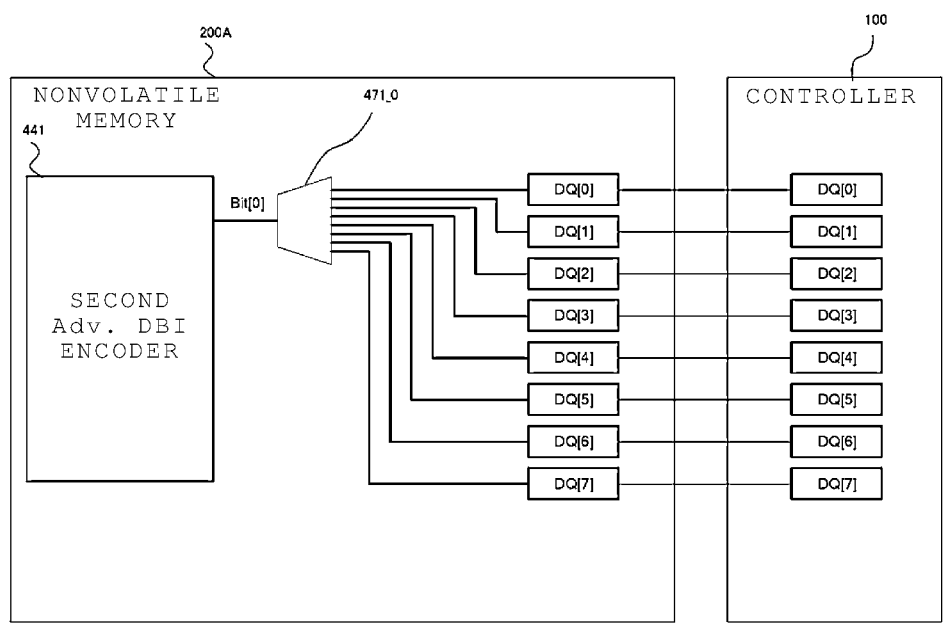
FIG. 20 is a block diagram illustrating details of a selector of the nonvolatile memory according to the second embodiment.

FIG. 20 is an enlarged view of the selector 471 provided in the memory system. The selector 471 is connected to each of DQ0 to DQ7 of the nonvolatile memory 200A.

2.2. Operation 2.2.1. During Write Operation

During the writing of data, the first data 700 stored in the second buffer memory of the first DBI encoder 400 is encoded into the third data 730 by the first DBI encoder 400 and the first Adv. DBI encoder 401. Thereafter, the third data 730 is transmitted to the nonvolatile memory 200 via the selectors 470_0 to 470_7 and DQ0 to DQ7 of the controller 100A. The second data 720 transmitted to the nonvolatile memory 200 is written to the memory cell array 260. Here, described will be a case in which the load of the communication during the transmission of the values of 1 is higher than the load of the communication during the transmission of the values of 0.

The selector 470 is set in advance, at the time of shipping of the memory system. For example, it is assumed that data having a bad communication quality of DQ0 and having more values of 1 than the data assigned to bit [7] is assigned to bit [0]. In this case, the selector 470_0 is set so that a signal is sent to DQ7, not to DQ0 of the controller 100A. The selector 470_7 is set to send a signal to DQ0, not to DQ7 of the controller 100A. During the writing of data, the data of bit [0] of the third data 730 is sent to the selector 470_0 and is transmitted to DQ7 of the nonvolatile memory 200 via DQ7 of the controller 100A. The data of bit [7] of the third data 730 is sent to the selector 470_7, and is transmitted to DQ0 of the nonvolatile memory 200 via DQ0 of the controller 100A. Which bit, the selector 470 sends to which data line may be freely set.

2.2.2. During Read Operation

During the reading of the data, the fourth data 740 stored in the sixth buffer memory of the second DBI encoder 440 is encoded into the sixth data 760 by the second DBI encoder 440 and the second Adv. DBI encoder 441. Thereafter, the sixth data 760 is transmitted to the controller 100 via the selectors 471_0 to 471_7 and DQ0 to DQ7 of the nonvolatile memory 200A.

The selector 471 is set in advance, at the time of shipping of the memory system. For example, it is assumed that data having a bad communication quality of DQ0 and having more values of 1 than the data assigned to bit [7] is assigned to bit [0]. In this case, the selector 471_0 is set to send a signal to DQ7, not to DQ0 of the nonvolatile memory 200A. The selector 471_7 is set to send a signal to DQ0, not to DQ7 of the nonvolatile memory 200A. During the reading of data, the data of bit [0] of the sixth data 760 is sent to the selector 471_0 and transmitted to DQ7 of the controller 100 via DQ7 of the nonvolatile memory 200A. The data of bit [7] of the sixth data 760 is sent to the selector 470_7 and transmitted to DQ0 of the controller 100 via DQ0 of the nonvolatile memory 200A. Which bit, the selector 470 sends to which data line may be freely set.

2.3. Effect

In the second embodiment described above, in the same manner as the first embodiment, the communication quality can be improved, and the power consumption can be reduced. In addition, in the second embodiment described above, among the bit lines provided in the memory system, if the communication quality of a certain bit line is bad, the communication quality during the transmission of data can be further improved by setting the selector 470 or the selector 471 so that data having a smaller number of 1's is assigned to this bit line.

In addition, the selector 470 and the selector 471 may be mounted as software or may be mounted as hardware.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a nonvolatile memory;
a memory bus that includes a plurality of data lines; and
a controller that includes an encoder configured to encode a first group of data including a plurality of first data, each first data having a plurality of bits, and is configured to transmit the encoded first group of data to the nonvolatile memory via the data lines,
wherein the encoder is configured to perform a first encoding process of generating a second group of data including a plurality of second data from the plurality of first data in the first group, and a second encoding process of generating a third group of data including a plurality of third data from the plurality of second data in the second group, each of the second data and each of the third data having the same number of bits as the first data, and
in the first encoding process, for each first data in the first group:
if the number of bits of the first data having a first logical value is greater than or equal to the number of bits of the first data having a second logical value, each bit of the second data has the same logical value as a corresponding bit of the first data; and
if the number of bits of the first data having the first logical value is less than the number of bits of the first data having the second logical value, each bit of the second data has an inverted logical value of the corresponding bit of the first data, and
wherein the second logical value is less likely to be the value in an n-th bit position of the plurality of third data in the third group than the value in any of the bit positions of the plurality of second data in the second group.

2. The memory system according to claim 1, wherein data written to the nonvolatile memory and each of the first data in the first group have randomized patterns.

3. The memory system according to claim 1, wherein
the third group of data is the encoded first group of data, and
the controller is configured to transmit to the nonvolatile memory each of the third data in the third group over the data lines along with a flag that indicates whether or not the number of bits having the first logical value in the first data from which the third data was generated is less than the number of bits having the second logical value in the first data from which the third data was generated.

4. The memory system according to claim 1, wherein the nonvolatile memory includes memory cells in which data are stored and a decoder configured to convert each of the third data in the third group into a fourth data, which are stored in the memory cells.

5. The memory system according to claim 1, wherein the nonvolatile memory includes an encoder configured to perform a third encoding process on a fourth group of data including a plurality of fourth data read from memory cells of the nonvolatile memory, to generate a fifth group of data including a plurality of fifth data, and a fourth encoding process of generating a sixth group of data including a plurality of sixth data from the plurality of fifth data in the fifth group, and in the third encoding process, for each fourth data in the fourth group:
  if the number of bits of the fourth data having the first logical value is greater than or equal to the number of bits of the fourth data having the second logical value, each bit of the fifth data has the same logical value as a corresponding bit of the fourth data; and
  if the number of bits of the fourth data having the first logical value is less than the number of bits of the fourth data having the second logical value, each bit of the fifth data has an inverted logical value of the corresponding bit of the fourth data, and wherein the second logical value is less likely to be the value in an m-th bit position of the plurality of sixth data in the sixth group than the value in any of bit positions of the plurality of fifth data in the fifth group.

6. The memory system according to claim 5, wherein the nonvolatile memory is configured to transmit to the controller each of the sixth data in the sixth group over the data lines along with a flag that indicates whether or not the number of bits having the first logical value in the fourth data from which the sixth data was generated is less than the number of bits having the second logical value in the fourth data from which the sixth data was generated.

7. The memory system according to claim 5, wherein the controller includes a decoder configured to convert each of the sixth data in the sixth group into a seventh data, and output the seventh data.

8. The memory system according to claim 7, wherein the controller is configured to transmit the seventh data output from the decoder to a host.

9. The memory system according to claim 5, wherein the nonvolatile memory further includes a switching circuit configured to switch connections between the encoder of the nonvolatile memory and the memory bus, so that the m-th bit of the sixth data output by the encoder of the nonvolatile memory is connectable to a predetermined data line of the memory bus.

10. The memory system according to claim 1, wherein the controller further includes a switching circuit configured to switch connections between the encoder of the controller and the memory bus, so that the n-th bit of the third data output by the encoder of the controller is connectable to a predetermined data line of the memory bus.

11. The memory system according to claim 1, wherein each of the first data in the first group is write data transmitted to the controller from a host and randomized.

12. A memory system comprising:
a nonvolatile memory; and
a controller that includes an encoder configured to encode a first group of data including a plurality of first data, each first data having a plurality of bits, and is configured to transmit the encoded first group of data, having a plurality of encoded data each having the same number of bits as the first data, to the nonvolatile memory via a plurality of data lines, wherein
the likelihood that the value in any of the bit positions of the first data is a first logical value is less than the likelihood that the value in any of the bit positions of the encoded data is the first logical value, and
a second logical value is less likely to be the value in an n-th bit position of the plurality of encoded data than in an m-th bit position of the plurality of encoded data that is adjacent to the n-th bit position.

13. The memory system according to claim 12, wherein data written to the nonvolatile memory and each of the first data in the first group have randomized patterns.

14. The memory system according to claim 12, wherein the controller is configured to transmit to the nonvolatile memory each of the encoded data in the encoded first group of data over the data lines along with a flag that indicates whether or not the number of bits having the first logical value in the first data from which the encoded data was generated is less than the number of bits having the second logical value in the first data from which the encoded data was generated.

15. The memory system according to claim 12, wherein the nonvolatile memory includes memory cells in which data are stored and a decoder configured to convert each of the encoded data in the encoded first group of data into a second data, which are stored in the memory cells.

16. The memory system according to claim 15, wherein the nonvolatile memory includes an encoder configured to encode a third group of data read from the memory cells, and is configured to transmit the encoded third group of data to the controller via the plurality of data lines.

17. The memory system according to claim 16, wherein the nonvolatile memory further includes a switching circuit configured to switch connections between the encoder of the nonvolatile memory and the plurality of data lines, so that a particular bit of the encoded data output by the encoder of the nonvolatile memory is connectable to a predetermined one of the data lines.

18. The memory system according to claim 16, wherein the controller includes a decoder configured to decode each encoded data in the encoded third group of data into a fourth data, and output the fourth data.

19. The memory system according to claim 18, wherein the controller is configured to transmit the fourth data output from the decoder to a host.

20. The memory system according to claim 12, wherein the controller further includes a switching circuit configured to switch connections between the encoder of the controller and the plurality of data lines, so that a particular bit of the encoded data output by the encoder of the controller is connectable to a predetermined one of the data lines.

* * * * *